(12) United States Patent
Muramatsu et al.

(10) Patent No.: US 7,326,299 B2
(45) Date of Patent: Feb. 5, 2008

(54) PROCESS LIQUID SUPPLY NOZZLE, PROCESS LIQUID SUPPLY DEVICE AND NOZZLE CLEANING METHOD

(75) Inventors: Makoto Muramatsu, Nirasaki (JP);
Hitoshi Hashima, Kikuchi-gun (JP);
Norihiko Sasagawa, Kikuchi-gun (JP);
Takeshi Hirao, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 108 days.

(21) Appl. No.: 10/784,202

(22) Filed: Feb. 24, 2004

(65) Prior Publication Data
US 2004/0173153 A1    Sep. 9, 2004

(30) Foreign Application Priority Data
Mar. 6, 2003   (JP)  ............................ 2003-060117
Mar. 6, 2003   (JP)  ............................ 2003-060118

(51) Int. Cl.
*B05B 7/16*   (2006.01)
(52) U.S. Cl. ...................................... 118/302; 118/323
(58) Field of Classification Search ................ 239/105, 239/106, 112, 303, 305; 134/104.1, 182, 134/183, 166 R, 169 R, 166 C; 68/205 R; 118/323, 302
See application file for complete search history.

(56) References Cited
U.S. PATENT DOCUMENTS
5,275,658 A     1/1994   Kimura
5,919,520 A *   7/1999   Tateyama et al. ........... 427/240
6,001,425 A *  12/1999   Stash et al. ............... 427/430.1
6,616,760 B2    9/2003   Kitano et al.
6,719,846 B2 *  4/2004   Nakamura et al. .......... 118/313
6,863,225 B2 *  3/2005   Nakamura ................... 239/105

FOREIGN PATENT DOCUMENTS
JP         2001-38272         2/2001

* cited by examiner

*Primary Examiner*—Brenda A Lamb
(74) *Attorney, Agent, or Firm*—Oblon, Spivak, McClelland, Maier & Neustadt, P.C.

(57) ABSTRACT

A process liquid supply nozzle comprises a substantially tubular main nozzle provided with a discharge port for discharging a coating liquid, a substantially bowl-shaped nozzle holder provided with a through-hole into which the main nozzle can be inserted, and a free space formed between the inner circumferential surface of the nozzle holder and the outer circumferential surface of the main nozzle, at least a prescribed cleaning liquid being supplied into the free space. The nozzle holder or the nozzle is relatively movable in the vertical direction such that the coating liquid is discharged from the discharge port under the state that the discharge port of the main nozzle projects downward from the through-hole, and the nozzle is cleaned with the cleaning liquid under the state that the nozzle is housed in the nozzle holder.

16 Claims, 15 Drawing Sheets

PROCESS LIQUID SUPPLY NOZZLE, PROCESS LIQUID SUPPLY DEVICE AND NOZZLE CLEANING METHOD

BACKGROUND OF THE INVENTION

1. Field of the Invention

The present invention relates to a process liquid supply nozzle and a process liquid supply device for supplying a process liquid onto a substrate such as a semiconductor wafer and to a nozzle cleaning method, e.g., a process liquid supply nozzle and a process liquid supply device for supplying a coating liquid so as to form an interlayer insulating film on the surface of, for example, a semiconductor wafer and to a nozzle cleaning method.

2. Description of the Related Art

In the manufacturing process of a semiconductor device, an interlayer insulating film is formed on a semiconductor wafer by, for example, an SOD (Spin On Dielectric) system. In the SOD system, the wafer is coated with a prescribed coating liquid by the spin-coating method so as to form a coated film, followed by applying a physical treatment such as heating and a chemical treatment to the coated film so as to form an interlayer insulating film, as in the technology for coating the wafer with, for example, a resist solution.

In the case of forming an interlayer insulating film made of, for example, a siloxane-series polymer or an organic polymer, a wafer is disposed first on a spin chuck arranged within a cup. Then, while rotating the wafer, a coating liquid diluted with an organic solvent is discharged from a process liquid supply nozzle onto the center of rotation of the wafer so as to permit the coating liquid to be spread uniformly over the entire surface of the wafer, thereby forming a coated film. Further, the wafer is subjected stepwise to, for example, a heat treatment under the environment that is determined in accordance with the object of the heat treatment. Incidentally, depending on the kind of the coating liquid used, it is necessary to apply an additional treatment such as a treatment under an ammonia atmosphere or a chemical treatment such as a solvent replacing treatment after formation of the coated film.

The process liquid supply nozzle used in the particular spin-coating process comprises, for example, a discharge port formed in the lower portion for discharging the process liquid toward the surface of the wafer. Also, the upper portion of the nozzle is held by a moving mechanism. The process liquid supply nozzle is moved by the moving mechanism between the center of rotation of the wafer within the cup and a drain cup arranged outside the cup.

When the process liquid is supplied onto the wafer surface, the process liquid remains in the tip portion of the process liquid supply nozzle, and the remaining process liquid is condensed or solidified with time. If the condensed liquid or the solidified material thus formed is dropped onto the wafer surface during the supply of the coating liquid onto the wafer surface, the coating is rendered nonuniform or the coated film is rendered nonuniform in thickness.

For overcoming the above-noted problem, the present applicant proposed previously a process liquid supply nozzle and a process liquid supply device constructed as shown in FIGS. 14 and 15 in Japanese Patent Disclosure (Kokai) No. 2001-38272. FIG. 14 is a vertical cross sectional view schematically showing the constructions of the process liquid supply nozzle and the process liquid supply device, and FIG. 15 is a horizontal cross sectional view showing the construction of the holding member shown in FIG. 14.

As shown in FIG. 14, a process liquid supply nozzle 51 for discharging the process liquid so as to form an insulating film on the surface of a wafer is fixed to a nozzle holding member 50. The process liquid supply nozzle 51 comprises an outer pipe 52 having a large diameter and an inner pipe 54 having a small diameter and arranged inside the outer pipe 52. A holding member 60 for holding the inner pipe 54 within the outer pipe 52 is formed in the vicinity of a discharge port 53 of the outer pipe 52. The inner pipe 54 is held by the holding member 60 such that a discharge port 55 at the tip of the inner pipe 54 projects downward from the discharge port 53 formed in the tip of the outer pipe 52. Incidentally, the holding member 60 comprises a plurality of holes 60a as shown in FIG. 15 so as not to obstruct the downward flow of the cleaning liquid supplied into the outer pipe 52, as described herein later.

The coating liquid that is to be supplied onto the surface of the wafer is stored in a tank 56, and the coating liquid is supplied from within the tank 56 into the inner pipe 54 by a pump 57. Also, a cleaning liquid for cleaning the periphery of the tip portion of the inner pipe 54 is stored in a tank 58, and the cleaning liquid is supplied from within the tank 58 into the outer pipe 52 by a pump 59.

In the process liquid supply device of the construction described above, the coating liquid stored in the tank 56 is supplied into the inner pipe 54 by the pump 57, and further supplied onto the wafer surface through the discharge port 55. After completion of the coating operation, the nozzle holding member 50 is moved so as to permit the process liquid supply nozzle 51 to be moved to a position above a drain cup (not shown) and, then, the coating liquid remaining inside the inner pipe 54 is discharged into the drain cup. It should be noted that the remaining coating liquid is attached to the periphery in the tip portion of the inner pipe 54, particularly, to the outer circumferential surface in the tip portion of the inner pipe 54. Such being the situation, the cleaning liquid stored in the tank 58 is supplied into the outer pipe 52 by the pump 59 so as to allow the cleaning liquid to flow downward along the outer circumferential surface in the tip portion of the inner pipe 54, thereby washing away the coating liquid attached to the periphery in the tip portion of the inner pipe 54.

In the cleaning method of the process liquid supply nozzle 51 described above, however, the cleaning liquid flows downward along a part of the outer circumferential surface of the inner pipe 54. In other words, the particular cleaning method gives rise to the problem that the cleaning liquid fails to flow downward uniformly over the entire outer circumferential surface of the inner pipe 54. To be more specific, if the cleaning liquid is brought into contact with the outer circumferential surface of the inner pipe 54 so as to form a flowing streak of the cleaning liquid on the outer circumferential surface noted above, the cleaning liquid that is supplied subsequently flows along the flowing streak thus formed, failing to flow uniformly over the entire outer circumferential surface of the inner pipe 54. It follows that a portion that was not washed is formed on the outer circumferential surface of the inner pipe 54. Naturally, the coating liquid is left unremoved in the portion that was not washed.

BRIEF SUMMARY OF THE INVENTION

An object of the present invention, which has been achieved in view of the situation described above, is to provide a process liquid supply nozzle and a process liquid supply device, which permit cleaning uniformly the entire outer circumferential surface of the nozzle in the cleaning stage of the process liquid supply nozzle so as to wash away the process liquid remaining on the outer circumferential surface of the nozzle, and to provide a nozzle cleaning method.

According to a first aspect of the present invention, there is provided a process liquid supply nozzle, comprising a substantially tubular nozzle provided with a discharge port for discharging a process liquid, a substantially bowl-shaped nozzle holder provided with a through-hole into which the nozzle can be inserted, and a free space formed between an inner circumferential surface of the nozzle holder and an outer circumferential surface of the nozzle, at least a prescribed cleaning liquid being supplied into the free space, wherein the nozzle holder and the nozzle are relatively movable in a vertical direction such that the process liquid is discharged from the discharge port of the nozzle under the state that the discharge port of the nozzle protrudes downward from the through-hole, and the nozzle is cleaned with a cleaning liquid under the state that the nozzle is housed in the nozzle holder.

According to a second aspect of the present invention, there is provided a process liquid supply nozzle, comprising a substantially tubular nozzle provided with a discharge port for discharging a process liquid, a substantially bowl-shaped nozzle holder provided with a hole portion into which the nozzle can be inserted, and a free space formed between an outer circumferential surface of the nozzle and an inner circumferential surface of the nozzle holder, at least a prescribed cleaning liquid being supplied into the free space, wherein the nozzle is arranged to extend through a central portion of the hole portion, and the outer circumferential surface of the nozzle is substantially in a point-to-point contact with a wall of the hole portion.

According to a third aspect of the present invention, there is provided a process liquid supply nozzle, comprising a substantially tubular nozzle provided with a discharge port for discharging a process liquid, a substantially bowl-shaped nozzle holder provided with a through-hole into which the nozzle can be inserted, a plurality of projections formed in a wall of the through-hole in a manner to project in a radial direction of the through-hole, and a free space formed between an outer circumferential surface of the nozzle and an inner circumferential surface of the nozzle holder, at least a prescribed cleaning liquid being supplied into the free space, wherein the projections are in a point-to-point contact with the outer circumferential surface of the nozzle.

According to a fourth aspect of the present invention, there is provided a process liquid supply nozzle, comprising a substantially tubular nozzle provided with a discharge port for discharging a process liquid, a substantially bowl-shaped nozzle holder provided with a through-hole into which the nozzle can be inserted, a plurality of projections formed on an outer circumferential surface of the nozzle in a manner to project in a radial direction of the nozzle, and a free space formed between the outer circumferential surface of the nozzle and an inner circumferential surface of the nozzle holder, at least a prescribed cleaning liquid being supplied into the free space, wherein the projections are in a point-to-point contact with a wall of the through-hole.

According to a fifth aspect of the present invention, there is provided a process liquid supply device, comprising:

a process liquid supply nozzle including a substantially tubular nozzle provided with a discharge port for discharging a process liquid, a substantially bowl-shaped nozzle holder provided with a through-hole into which the nozzle can be inserted, and a free space formed between an inner circumferential surface of the nozzle holder and an outer circumferential surface of the nozzle;

a process liquid supply mechanism for supplying the process liquid into the nozzle;

a cleaning liquid supply mechanism for supplying a prescribed cleaning liquid into the free space for cleaning the nozzle; and a nozzle moving mechanism for relatively moving the nozzle and the nozzle holder in a vertical direction such that the process liquid is discharged from the discharge port of the nozzle under the state that the discharge port protrudes downward from the through-hole of the nozzle holder or the nozzle is cleaned with the cleaning liquid under the state that the nozzle is housed in the nozzle holder.

According to a sixth aspect of the present invention, there is provided a process liquid supply device, comprising:

a process liquid supply nozzle including a substantially tubular nozzle provided with a discharge port for discharging a prescribed process liquid, a substantially bowl-shaped nozzle holder provided with a hole portion into which the nozzle can be inserted, and a free space formed between an inner circumferential surface of the nozzle holder and an outer circumferential surface of the nozzle, the nozzle being arranged to extend through a central portion of the hole portion, and the outer circumferential surface of the nozzle being substantially in a point-to-point contact with a wall of the hole portion;

a process liquid supply mechanism for supplying the prescribed process liquid into the nozzle; and a cleaning liquid supply mechanism for supplying a prescribed cleaning liquid into the free space for cleaning the nozzle.

According to a seventh aspect of the present invention, there is provided a process liquid supply device, comprising:

a process liquid supply nozzle including a substantially tubular nozzle provided with a discharge port for discharging a prescribed process liquid, a substantially bowl-shaped nozzle holder provided with a through-hole into which the nozzle can be inserted, a plurality of projections formed on a wall of the through-hole in a manner to project in a radial direction of the through-hole, and a free space formed between an inner circumferential surface of the nozzle holder and an outer circumferential surface of the nozzle, the nozzle being arranged to extend through a central portion of the through-hole, and the outer circumferential surface of the nozzle being substantially in a point-to-point contact with the projections;

a process liquid supply mechanism for supplying the prescribed process liquid into the nozzle; and a cleaning liquid supply mechanism for supplying a prescribed cleaning liquid into the free space for cleaning the nozzle.

According to an eighth aspect of the present invention, there is provided a process liquid supply device, comprising:

a process liquid supply nozzle including a substantially tubular nozzle provided with a discharge port for discharging a prescribed process liquid, a substantially bowl-shaped nozzle holder provided with a through-hole into which the nozzle can be inserted, a plurality of projections formed on an outer circumferential surface of the nozzle in a manner to project in a radial direction of the nozzle, and a free space formed between an inner circumferential surface of the nozzle holder and the outer circumferential surface of the nozzle, the nozzle being arranged to extend through a central portion of the through-hole, and the projections being substantially in a point-to-point contact with a wall of the through-hole;

a process liquid supply mechanism for supplying the prescribed process liquid into the nozzle; and a cleaning liquid supply mechanism for supplying a prescribed cleaning liquid into the free space for cleaning the nozzle.

According to a ninth aspect of the present invention, there is provided a nozzle cleaning method for removing a residual process liquid attached to a substantially tubular nozzle for discharging a prescribed process liquid, comprising the steps of:

housing the nozzle in a substantially bowl-shaped nozzle holder having a through-hole formed in a lower edge portion; and removing the residual process liquid attached to the nozzle by means of supplying a cleaning liquid into a free space formed between an outer circumferential surface of the nozzle and an inner circumferential surface of the nozzle holder and discharging the cleaning liquid from the free space through the through-hole such that a prescribed amount of the cleaning liquid is kept stored in the free space.

Further, according to a tenth aspect of the present invention, there is provided a nozzle cleaning method for removing a residual process liquid attached to a substantially tubular nozzle for discharging a prescribed process liquid, comprising:

mounting the nozzle in a substantially bowl-shaped nozzle holder having a through-hole formed in a lower edge portion;

cleaning the nozzle to remove the residual process liquid attached to the nozzle by means of supplying a cleaning liquid into a free space formed between an outer circumferential surface of the nozzle and an inner circumferential surface of the nozzle holder and discharging the cleaning liquid from the free space through-hole such that a prescribed amount of the cleaning liquid is kept stored in the free space; and cleaning the nozzle to remove the remaining process liquid by means of rotating any one of the nozzle and the nozzle holder by a prescribed angle and then supplying again the cleaning liquid into the free space.

According to the present invention, it is possible to wash the tip portion of the nozzle, particularly the outer circumferential surface of the nozzle, uniformly in the nozzle cleaning step so as to wash away without fail the process liquid remaining in the tip portion of the nozzle.

DETAILED DESCRIPTION OF THE INVENTION

The present invention will now be described in detail with reference to the accompanying drawings. The following description is directed as an example to a coating process unit mounted to an SOD system for forming an interlayer insulating film by a spin-coating method.

Figure 1:
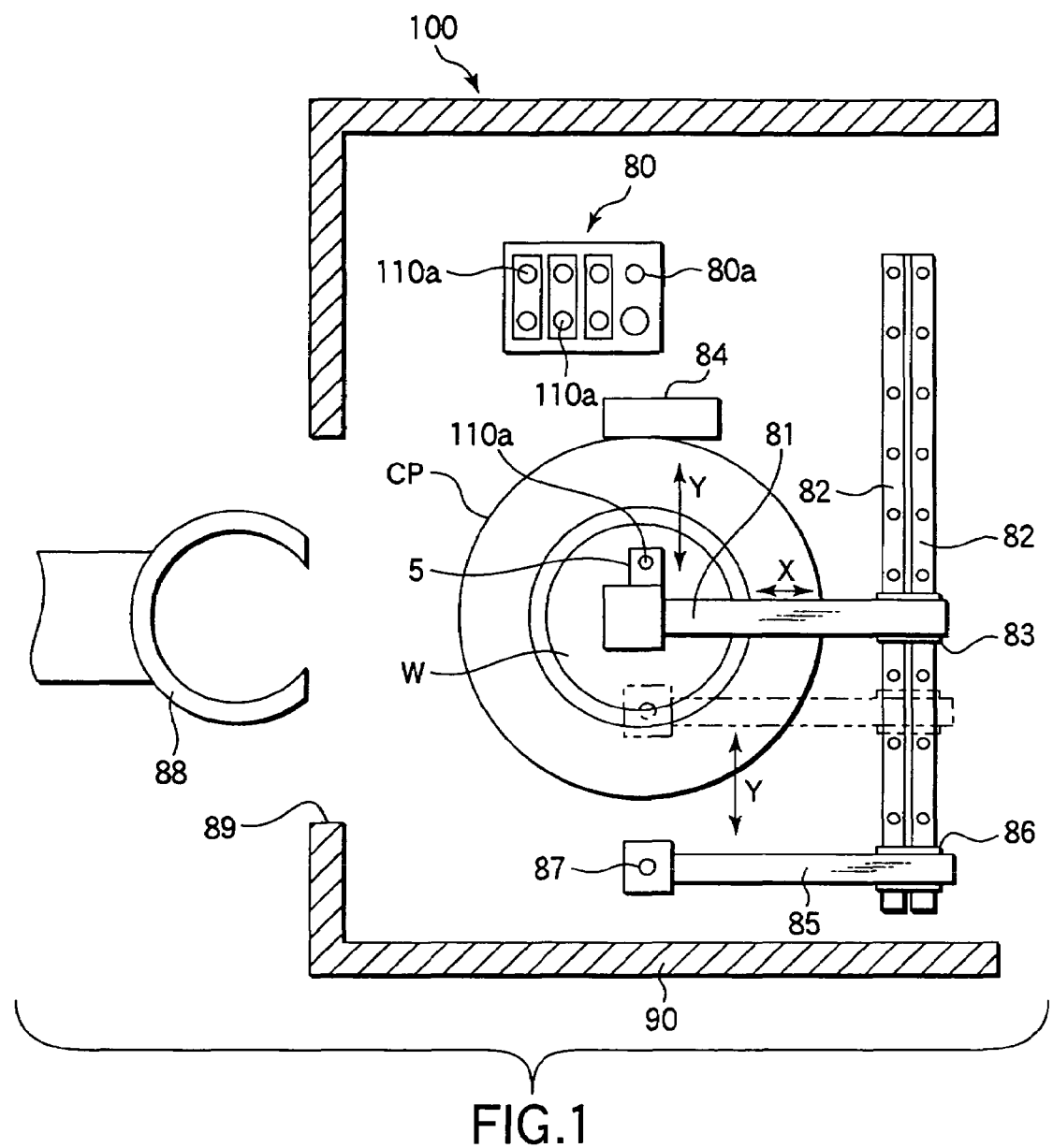
FIG. 1 is a plan view schematically showing the construction of a coating process unit.
Figure 2:
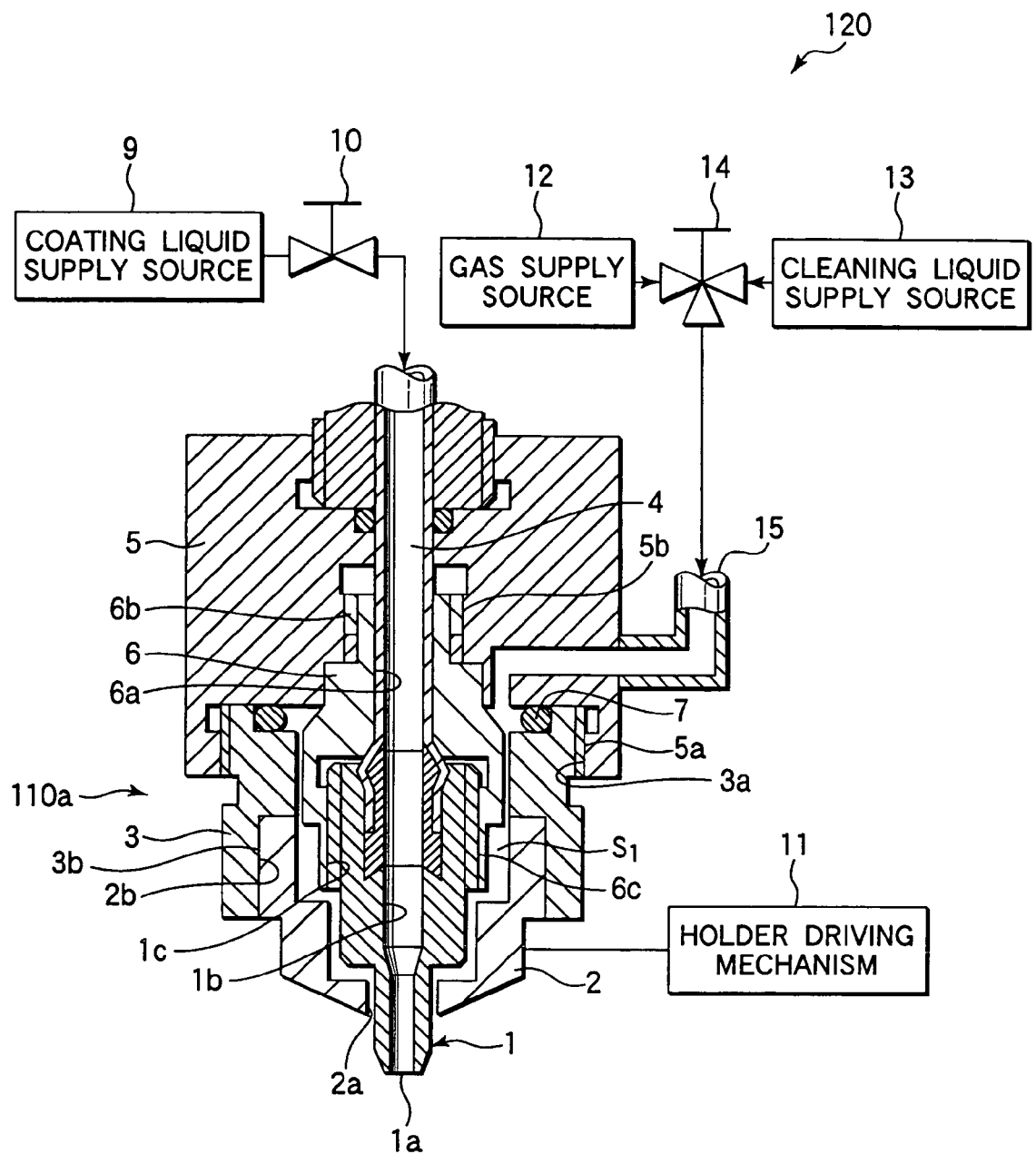
FIG. 2 schematically shows the construction of a coating liquid supply nozzle and the construction of a process liquid supply section according to a first embodiment of the present invention.
Figure 3:
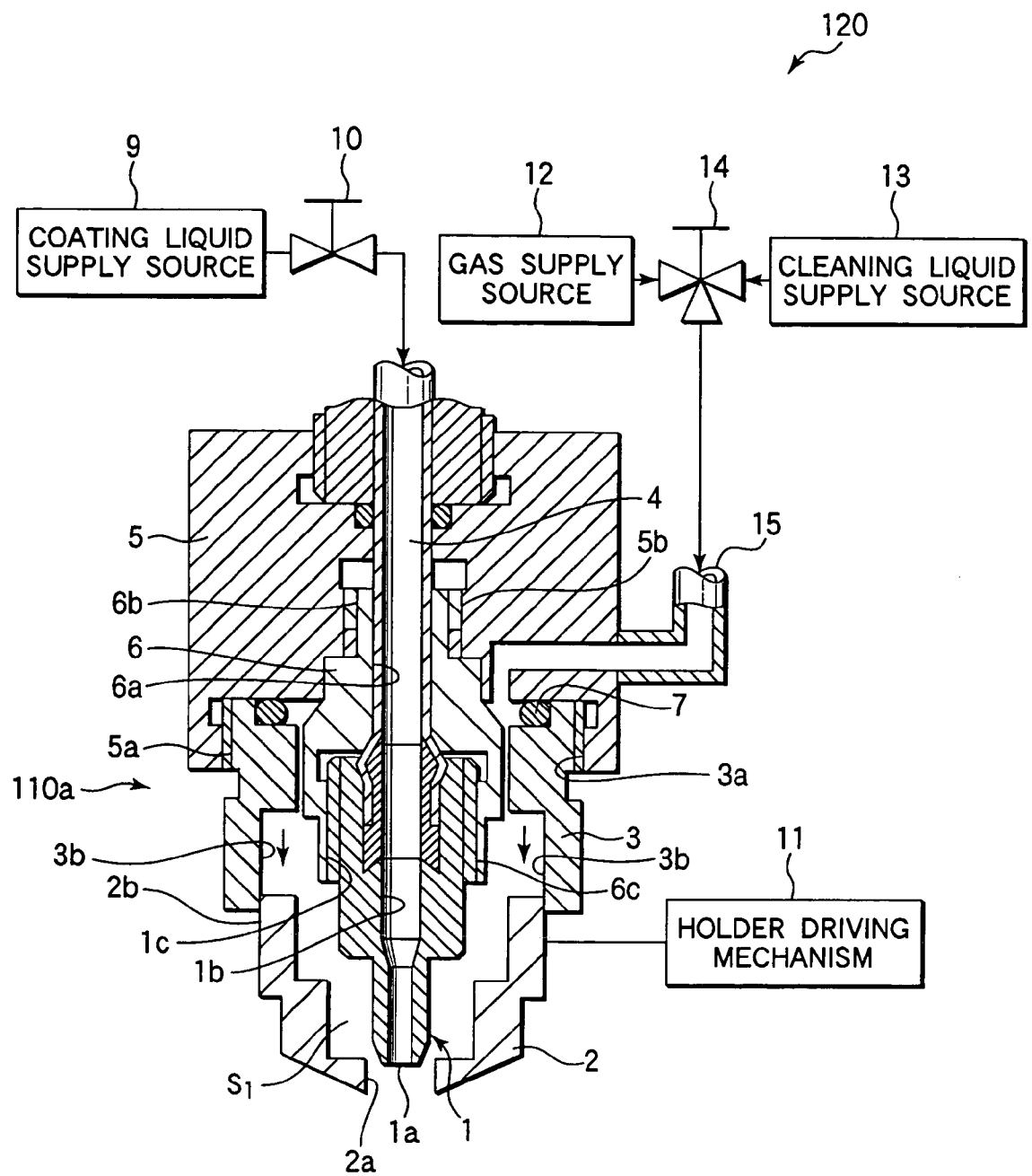
FIG. 3 is a vertical cross sectional view showing the cleaning state of the coating liquid supply nozzle shown in FIG. 2.

FIG. 1 is a plan view schematically showing the construction of a coating process unit 100. FIG. 2 schematically shows the construction of a coating liquid supply nozzle 110a according to a first embodiment of the process liquid supply nozzle of the present invention, and also shows schematically the construction of a process liquid supply section 120 for supplying a coating liquid, a cleaning liquid, etc. into the coating liquid supply nozzle 110a. The coating liquid supply nozzle 110a is mounted to the coating process unit 100 shown in FIG. 1. Further, FIG. 3 is a vertical cross sectional view showing the cleaning state of the coating liquid supply nozzle 110a.

An annular cup CP is arranged in substantially the central portion of the unit bottom plate of the coating process unit 100, and a spin chuck (not shown) is arranged inside the annular cup CP. The spin chuck, which holds a wafer W by means of vacuum suction, is rotated by a rotary driving force of a driving motor (not shown). An open portion 89 for transferring the wafer W into and out of the coating process unit 100 is formed in a casing 90 of the coating process unit 100. A pincette 88 mounted to the SOD system is movable into and out of the coating process unit 100 so as to carry out the delivery of the wafer W between the pincette 88 and the spin chuck.

The coating process unit 100 includes the coating liquid supply nozzle 110a for discharging the coating liquid onto the wafer W held by the spin chuck, a nozzle scan arm 81 having a holding member 5 for holding the coating liquid supply nozzle 110*a* mounted to the tip portion thereof, and a nozzle waiting section 80 arranged outside the cup CP for allowing the coating liquid supply nozzle 110*a* to be mounted to or detached from the nozzle scan arm 81.

The nozzle scan arm 81, which is mounted to an upper edge portion of a vertical support member 83 that is horizontally movable on a guide rail 82 arranged on the unit bottom plate in a manner to extend in one direction (Y-direction), can be moved in the Y-direction together with the vertical support member 83 by a Y-direction driving mechanism (not shown). Also, the vertical support member 83 is provided with a Z-direction driving mechanism (not shown). The height position of the coating liquid supply nozzle 110*a* held by the nozzle scan arm 81 can be adjusted by the Z-direction driving mechanism. Further, the nozzle scan arm 81 can be elongated in an X-direction by an X-direction driving mechanism (not shown). It follows that it is possible to move the coating liquid supply nozzle 110*a* held by the nozzle scan arm 81 to a prescribed discharge position of the coating liquid above the wafer W held by the spin chuck. It is also possible to permit selectively the coating liquid supply nozzle 110*a* to be mounted to and detached from the nozzle scan arm 81 at the nozzle waiting section 80.

Incidentally, in order to suppress the solidification or deterioration of the coating liquid in the tip portion of the coating liquid supply nozzle 110*a* in the nozzle waiting section 80, the tip portion of the coating liquid supply nozzle 110*a* is inserted into a port 80*a* of a solvent atmosphere chamber (not shown) so as to expose the tip portion to the solvent vapor within the solvent atmosphere chamber. Also, a plurality of coating liquid supply nozzles 110*a* are arranged in the nozzle waiting section 80 for selectively using the nozzles 110*a* in accordance with the kind of the coating liquid used.

A drain cup 84 is arranged between the cup CP and the nozzle waiting section 80 for performing a dummy dispense or a cleaning processing of the coating liquid supply nozzle 110*a* prior to or after the supply of the coating liquid onto the wafer W.

The coating process unit 100 further includes a rinse nozzle 87 for performing the side-rinsing for removing the coated film from the peripheral portion of the wafer W, a rinse nozzle scan arm 85 for holding the rinse nozzle 87, and a vertical support member 86 supporting the rinse nozzle scan arm 85. The vertical support member 86 can be moved by a Y-direction driving mechanism (not shown) in the Y-direction on the guide rail 82. The rinse nozzle scan arm 85 and the rinse nozzle 87 can be moved between the nozzle waiting position formed sideward of the cup CP, which is denoted by solid lines in FIG. 1, and a rinsing solution discharge position formed right above the peripheral portion of the wafer W held by the spin chuck, which is denoted by dotted lines in FIG. 1. After formation of a coated film on the surface of the wafer W, a prescribed solvent is supplied from the rinse nozzle 87 onto the peripheral portion of the wafer W for dissolving and removing the coated film from the peripheral portion of the wafer W. As a result, it is possible to prevent the dust generation. For example, if the rinsing processing for removing the coated film from the peripheral portion of the wafer W is not applied, it is possible for the coated film to be brought into contact with the devices included in the transfer system such as the pincette 88 in the transfer stage of the wafer W having the coated film formed thereon so as to cause the coated film to be peeled off and, thus, to generate dust.

Incidentally, the piping for supplying the coating liquid and the solvent into the coating liquid supply nozzle 110*a* and the rinse nozzle 87 and the shutter for opening/closing the open portion 89 are omitted in FIG. 1.

The construction of the process liquid supply section 120 for supplying the coating liquid and a cleaning liquid into the coating liquid supply nozzle 110*a* and the construction of the coating liquid supply nozzle 110*a* will now be described more in detail.

The process liquid supply section 120 includes a coating liquid supply source 9 for supplying the coating liquid into the coating liquid supply nozzle 110*a*, a valve 10 for controlling the supply of the coating liquid from the coating liquid supply source 9 into the coating liquid supply nozzle 110*a*, a cleaning liquid supply source 13 for supplying a cleaning liquid into the coating liquid supply nozzle 110*a* for cleaning the coating liquid supply nozzle 110*a* itself, a gas supply source 12 for supplying a prescribed gas into the coating liquid supply nozzle 110*a* in the cleaning and/or drying stage of the coating liquid supply nozzle 110*a*, and a valve 14 for controlling the supply of the cleaning liquid and/or gas into the coating liquid supply nozzle 110*a*.

The coating liquid supply source 9 includes, for example, a tank for storing the coating liquid and a pump for supplying the coating liquid from within the tank. The cleaning liquid supply source 13 is similar to the coating liquid supply source 9 in construction.

The coating liquid supply nozzle 110*a* includes a main nozzle 1 constituting the member for substantially discharging the coating liquid, a nozzle holder 2 capable of housing the main nozzle 1 and having a through-hole 2*a* through which the lower portion of the main nozzle 1 can be inserted, a holder base 3 for holding the nozzle holder 2 such that the held nozzle holder 2 is movable in the vertical direction, a coating liquid supply pipe 4 for supplying the coating liquid into the main nozzle 1, and a nozzle fixing portion 6 serving to fix the main nozzle 1 and detachable from a holding member 5.

The lower portion of the main nozzle 1 is formed of a cylinder having a small diameter, and the lower tip of the cylinder forms a discharge port 1*a* of the coating liquid. Also, the upper portion of the main nozzle 1 is formed of a cylinder having a diameter larger than that of the lower portion, and the central portion in the axial direction of the upper portion forms a through-hole 1*b* communicating with the discharge port 1*a*. The coating liquid supply pipe 4 is fitted within the through-hole 1*b*. A screw portion 1*c* is formed on the outer circumferential surface in the upper portion of the main nozzle 1 so as to be engaged with a screw portion 6*c* formed in the nozzle fixing portion 6.

Fluoroplastics excellent in the heat resistance and the resistance to the chemicals are used suitably for forming the main nozzle 1. Fluoroplastics are generally hydrophobic (water repellent). However, the outer circumferential surface of the main nozzle 1 is modified to exhibit the hydrophilicity. The surface of the main nozzle 1 formed of fluoroplastics is made hydrophilic by applying, for example, a surface treatment utilizing a chemical treatment such as a UV irradiation or a roughening treatment utilizing a mechanical treatment such as the filing. If the outer circumferential surface of the main nozzle 1 is made hydrophilic in this fashion, the cleaning liquid is allowed to flow downward uniformly along the entire outer circumferential surface of the main nozzle 1 in the cleaning stage of the main nozzle 1, as described herein later.

The nozzle fixing portion 6 includes a through-hole 6*a* into which the coating liquid supply pipe 4 is inserted for fixing the pipe 4. A screw portion 6b is formed on the outer circumferential surface in the upper portion of the nozzle fixing portion 6 so as to be engaged with a screw portion 5b of the holding member 5 fixed to the nozzle scan arm 81. In this fashion, the nozzle fixing portion 6 can be fixed to the holding member 5. Since the main nozzle 1 is fixed to the holding member 5 via the nozzle fixing portion 6 as described above, the main nozzle 1 is not rocked during the spin coating operation.

The nozzle holder 2 is substantially bowl-shaped, and a free space $S_1$ is formed between the inner circumferential surface of the nozzle holder 2 and the outer circumferential surface of the main nozzle 1. As described herein later, a cleaning liquid or gas for cleaning or drying the main nozzle 1 can be introduced into the free space $S_1$. A screw portion 2b is formed on the outer circumferential surface of the nozzle holder 2 so as to be engaged with a screw portion 3b of the holder base 3.

The nozzle holder 2 can be rotated by a holder driving mechanism 11. The nozzle holder 2 can be moved in the vertical direction in accordance with rotation of the nozzle holder 2. As shown in FIG. 2, when the coating liquid is discharged from the main nozzle 1, the nozzle holder 2 is positioned such that the lower portion of the main nozzle 1 is allowed to protrude downward from the through-hole 2a of the nozzle holder 2. On the other hand, when the main nozzle 1 is washed, the nozzle holder 2 is positioned such that the main nozzle 1 is housed inside the nozzle holder 2. Also, the nozzle holder 2 is detachable from the holder base 3 if rotated by the holder driving mechanism 11.

It is possible for the holder driving mechanism 11 to be arranged in the vicinity of, for example, the drain cup 84 in which the cleaning processing of the main nozzle 1 is performed such that the mechanism 11 is detachable together with the nozzle holder 2. It is also possible to arrange the holder driving mechanism 11 so as to be movable together with the coating liquid supply nozzle 110a. Also, it is desirable for the driving of the holder driving mechanism 11 to be controlled in accordance with a prescribed recipe. However, the driving of the holder driving mechanism 11 can also be controlled manually.

The coating liquid supply nozzle 110a in the nozzle waiting section 80 can be renewed by collectively substituting another main nozzle and another nozzle holding portion for the main nozzle 1 and the nozzle holding portion 6 under the state that the nozzle holder 2 is detached from the holder base 3.

The holding member 5 includes a cleaning liquid/gas supply port 15 for supplying a cleaning liquid for cleaning the main nozzle 1 or a gas such as a nitrogen gas ($N_2$) for drying the main nozzle 1 after the cleaning processing into the free space $S_1$. The cleaning liquid and/or gas is supplied from the cleaning liquid supply source 13 and the gas supply source 12 into the cleaning liquid/gas supply port 15 through the valve 14. The holding member 5 is joined to the holder base 3 by the engagement between a screw portion 5a formed in the holding member 5 and a screw portion 3a formed in the holder base 3. A packing 7 is arranged in the joining portion so as to prevent the leakage of the cleaning liquid or the gas.

The procedure for forming a coated film on the wafer W will now be described in the case of using the coating process unit 100 including the coating liquid supply nozzle 110a of the construction described above and the process liquid supply section 120.

Originally, the coating liquid supply nozzle 110a is positioned in the nozzle waiting section 80 arranged outside the cup CP. In the first step, the wafer W held by the pincette 88 is delivered onto the spin chuck so as to render the wafer W ready for the rotation. Then, the coating liquid supply nozzle 110a is put under the state that the discharge port 1a of the main nozzle 1 protrudes downward from the nozzle holder 2, i.e., the state that the lower portion of the main nozzle 1 protrudes downward from the through-hole 2a, as shown in FIG. 2. Under the particular condition, the nozzle scan arm 81 is scanned in the Y-direction so as to determine the position of the coating liquid supply nozzle 110a such that the discharge port 1a of the main nozzle 1 is positioned right above the center of the wafer W with a prescribed distance provided between the discharge port 1a and the surface of the wafer W.

In the next step, the wafer W is rotated at a prescribed rotating speed, followed by opening the valve 10 so as to supply the coating liquid from the coating liquid supply source 9 into the main nozzle 1 through the coating liquid supply pipe 4. As a result, a prescribed amount of the coating liquid is discharged from the discharge port 1a onto the surface of the wafer W. The coating liquid discharged onto the wafer W is centrifugally expanded over the entire surface of the wafer W because the wafer W is kept rotated so as to form a coated film. Incidentally, it is possible to control the thickness of the coated film by increasing the rotating speed of the wafer W after the coating liquid has been expanded over the entire surface of the wafer W.

After the discharge of the coating liquid onto the wafer W is finished, the valve 10 is closed. In this stage, the discharge port 1a of the main nozzle 1 is held open. However, since the valve 10 is closed, the coating liquid remaining between the valve 10 and the discharge port 1a of the main nozzle 1 does not drop from the discharge port 1a because of the surface tension of the coating liquid.

In the next step, the nozzle scan arm 81 is driven in the Y-direction so as to move the coating liquid supply nozzle 110a onto a region above the drain cup 84. Also, the rinse nozzle 87 is moved to a position right above the peripheral portion of the wafer W, and the rinsing solution is discharged onto the peripheral portion of the wafer W under the state that the wafer W is kept rotated at a prescribed rotating speed so as to remove the coated film formed in the peripheral portion of the wafer W. Then, the rinse nozzle 87 is moved to a region outside the cup CP, and the wafer W held by the spin chuck is transferred by the pincette 88 from within the coating process unit 100.

It should be noted that the coating liquid is left attached to the tip portion of the main nozzle 1 after discharge of the coating liquid. Therefore, the residual coating liquid attached to the tip portion of the main nozzle 1 is removed in the next step. In the cleaning processing of the main nozzle 1, the holder driving mechanism 11 is driven so as to move downward the nozzle holder 2 while rotating the nozzle holder 2, thereby allowing the main nozzle 1 to be housed in the nozzle holder 2 as shown in FIG. 3. Then, the valve 14 is opened on the side of the cleaning liquid supply source 13 so as to supply the cleaning liquid from the cleaning liquid supply source 13 into the free space $S_1$ through the cleaning liquid/gas supply port 15. In this stage, the cleaning liquid supplied into the free space $S_1$ is allowed to flow into the drain cup 84 through the through-hole 2a on the lower edge of the nozzle holder 2 while maintaining the state that the free space $S_1$ is filled to some extent with the cleaning liquid. As a result, the residual coating liquid attached to the main nozzle 1 is discharged from the free space $S_1$ together with the cleaning liquid.

As described previously, the outer circumferential surface of the main nozzle 1 is rendered hydrophilic. In addition, a prescribed amount of the cleaning liquid is kept stored in the free space $S_1$. It follows that it is possible to wash uniformly the entire region of the main nozzle 1. In other words, the particular construction of the present invention makes it possible to overcome the inconvenience inherent in the conventional coating liquid supply nozzle, i.e., the inconvenience that the condensed coating liquid and the solidified material of the coating liquid remaining in the tip portion of the nozzle are caused to drop onto the wafer W so as to bring about a nonuniform coating or the nonuniformity in the thickness of the coated film.

Incidentally, in allowing the main nozzle 1 to be housed in the nozzle holder 2, it is possible for the residual coating liquid attached to the tip portion of the main nozzle 1 to be attached to the wall of the through-hole 2a of the nozzle holder 2. However, the particular cleaning method of the present invention also permits removing the residual coating liquid attached to the wall of the through-hole 2a.

In the next step, the outer circumferential surface of the main nozzle 1 and the inner circumferential surface of the nozzle holder 2 are subjected to a drying processing. The drying processing is performed by closing the valve 14 on the side of the cleaning liquid supply source 13 and opening the valve 14 on the side of the gas supply source 12 so as to supply a $N_2$ gas of a prescribed pressure from the gas supply source 12 into the free space $S_1$ through the cleaning liquid/gas supply port 15. The $N_2$ gas supplied into the free space $S_1$ blows away the residual cleaning liquid attached to the outer circumferential surface of the main nozzle 1 and to the inner circumferential surface of the nozzle holder 2 so as to discharge the blown cleaning liquid from the lower end of the nozzle holder 2. Incidentally, the drying time can be shortened by increasing the pressure of the $N_2$ gas supplied into the free space $S_1$. A prescribed time later, the valve 14 on the side of the gas supply source 12 is closed so as to stop the $N_2$ gas supply into the free space $S_1$, thereby finishing the drying processing.

Where the coating liquid is discharged onto a new wafer W after completion of the series of cleaning processing applied to the main nozzle 1 as described above, the nozzle holder 2 is moved upward by rotating the nozzle holder 2 so as to allow the tip portion of the main nozzle 1 to project downward from the lower edge of the nozzle holder 2. Under the particular state, a dummy dispense is performed for discharging a prescribed amount of the coating liquid held within the main nozzle 1, followed by moving upward the coating liquid supply nozzle 110a to a prescribed height position right above the center of the wafer W so as to permit a prescribed amount of the coating liquid to be discharged onto the wafer W. On the other hand, where there is a prescribed time until the discharge of the coating liquid onto the new wafer W, the coating liquid supply nozzle 110a is moved into the nozzle waiting section 80 so as to prevent the coating liquid from being dried in the tip portion of the main nozzle 1.

Incidentally, it is not absolutely necessary for the cleaning processing of the coating liquid supply nozzle 110a to be performed after the wafer W is coated with the coating liquid. In other words, it is also possible to apply the cleaning processing to the coating liquid supply nozzle 110a before the wafer W is coated with the coating liquid. Also, it is not absolutely necessary to apply the cleaning processing to the coating liquid supply nozzle 110a every time the coating liquid is discharged onto the wafer W. In other words, it is also possible to apply the cleaning processing after the coating liquid is discharged onto a plurality of wafers W or at a prescribed time interval. Further, in the cleaning method of the coating liquid supply nozzle 110a described above, the cleaning and the drying of the main nozzle 1 are performed by supplying the cleaning liquid and, then, the $N_2$ gas into the free space $S_1$. However, it is also possible to perform the cleaning processing of the main nozzle 1 by supplying the cleaning liquid and the $N_2$ gas simultaneously into the free space $S_1$, followed by performing the drying processing by supplying the $N_2$ gas into the free space $S_1$. In the cleaning processing performed by supplying the cleaning liquid and the $N_2$ gas simultaneously into the free space $S_1$, it is possible to obtain the cleaning effect produced by the bubbles of the gas in addition to the cleaning effect produced by the cleaning liquid itself so as to enhance the reliability of the cleaning processing applied to the main nozzle 1. It follows that the cleaning efficiency can be improved, and the cleaning time can be shortened.

Figure 4:
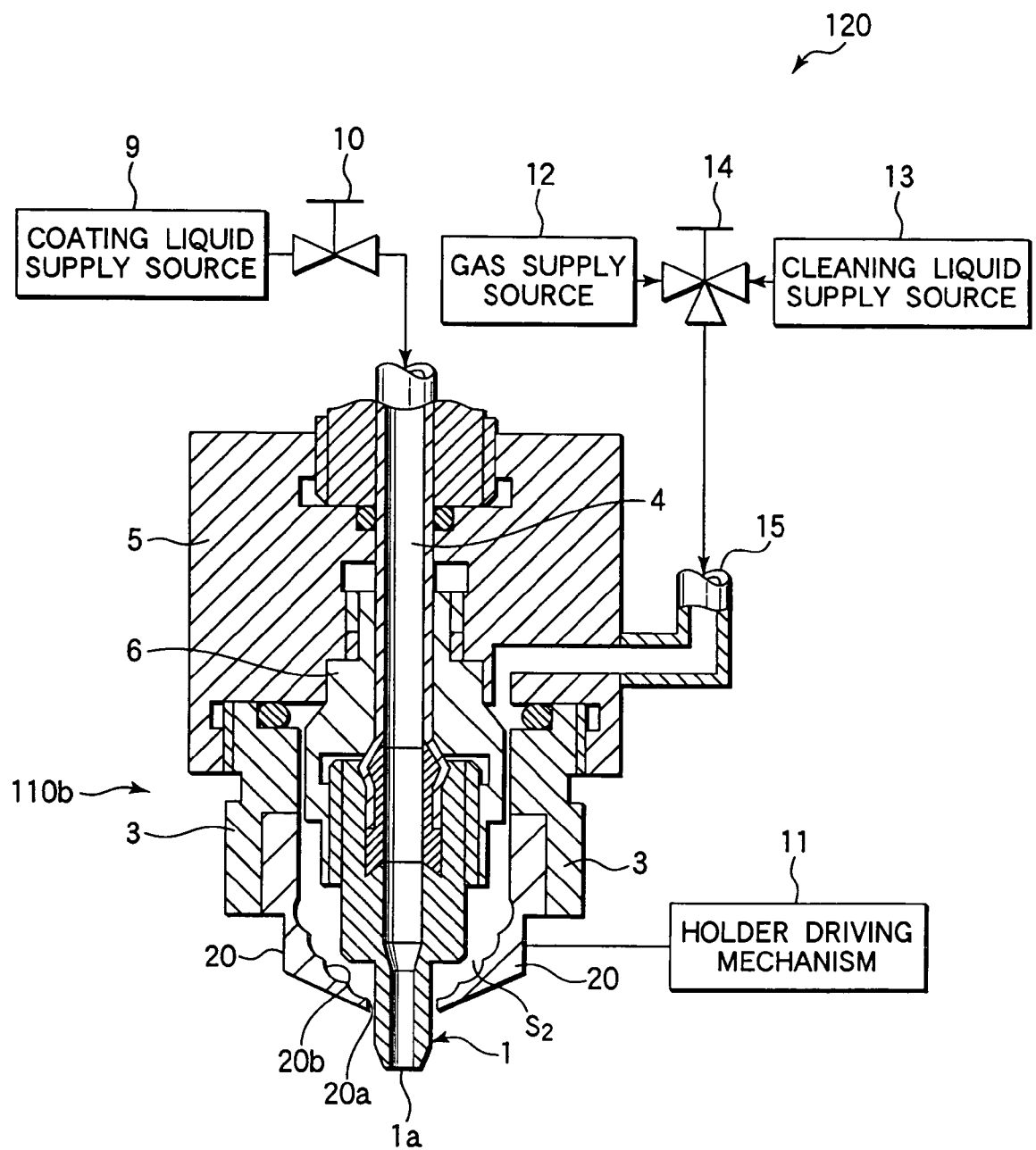
FIG. 4 is a cross sectional view schematically showing the construction of a coating liquid supply nozzle according to a second embodiment of the present invention.

A coating liquid supply nozzle according to a second embodiment of the present invention will now be described. FIG. 4 is a vertical cross sectional view schematically showing the construction of a coating liquid supply nozzle 110b according to a second embodiment of the coating liquid supply nozzle of the present invention, FIG. 5 is a horizontal cross sectional view showing a nozzle holder 20 constituting the coating liquid supply nozzle 110b, and FIG. 6 is a vertical cross sectional view showing the cleaning state of the coating liquid supply nozzle 110b.

The coating liquid supply nozzle 110b is equal in construction to the coating liquid supply nozzle 110a described previously, except that the nozzle holder 20 included in the coating liquid supply nozzle 110b differs in shape from the nozzle holder 2 included in the coating liquid supply nozzle 110a. Such being the situation, the following description is directed mainly to the construction and function of the nozzle holder 20 included in the coating liquid supply nozzle 110b.

Figure 5:
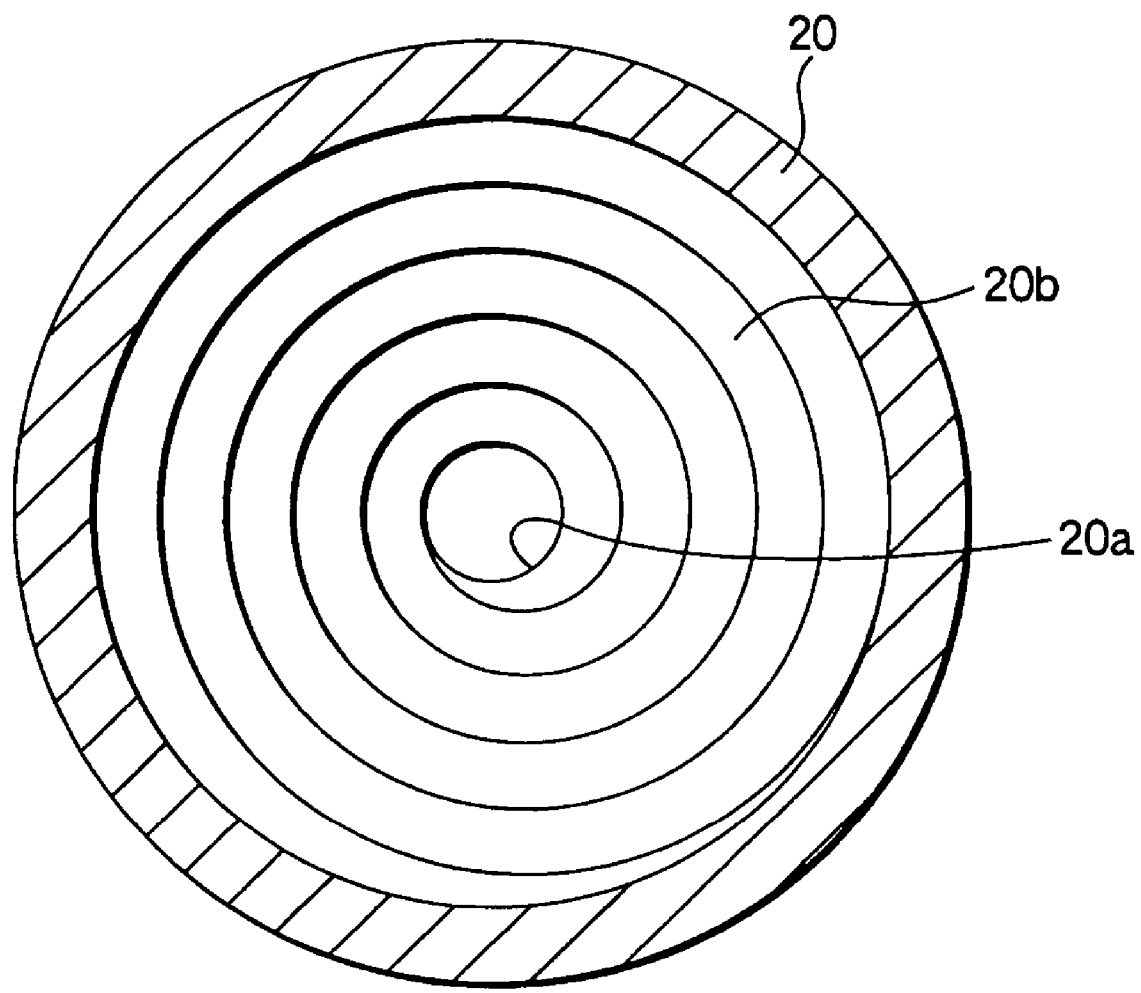
FIG. 5 is a horizontal cross sectional view showing the construction of the nozzle holder shown in FIG. 4.
Figure 6:
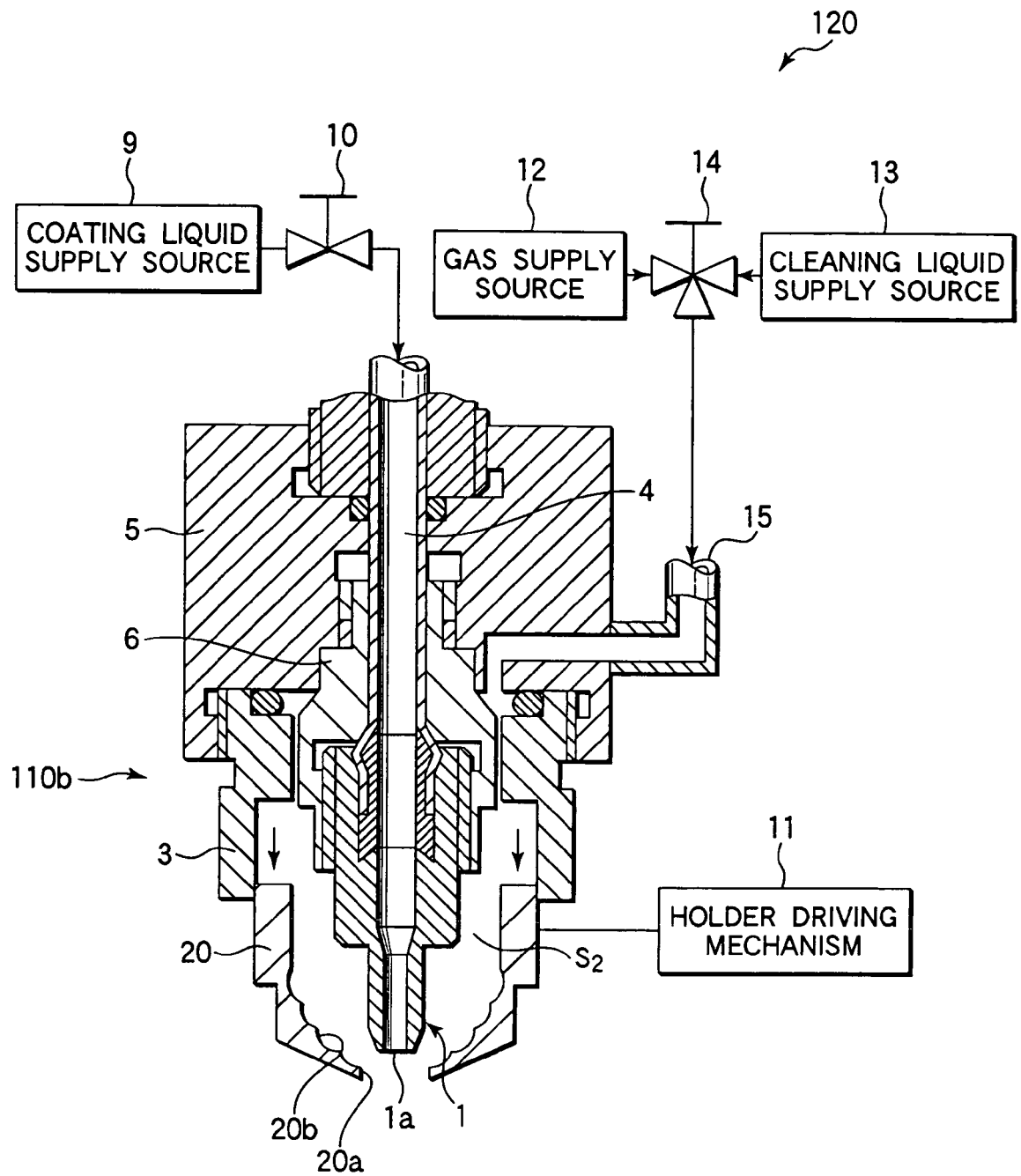
FIG. 6 is a vertical cross sectional view showing the cleaning state of the coating liquid supply nozzle shown in FIG. 4.

As shown in FIG. 5, a spiral groove 20b is formed on the inner circumferential surface of the nozzle holder 20. The spiral groove 20b starts from substantially the central portion in the longitudinal direction of the nozzle holder 20 so as to extend to reach a through-hole 20a formed in the lower end portion of the nozzle holder 20. The spiral groove 20b generates a whirling stream in the cleaning liquid supplied into a free space $S_2$ formed between the outer circumferential surface of the main nozzle 1 and inner circumferential surface of the nozzle holder 20.

As shown in FIG. 4, the coating liquid is discharged from the coating liquid supply nozzle 110b under the state that the main nozzle 1 projects downward from the nozzle holder 20. Also, as shown in FIG. 6, the nozzle holder 20 is moved downward by the holder driving mechanism 11 in the cleaning stage of the main nozzle 1 such that the main nozzle 1 is washed under the state that the entire main nozzle 1 is housed in the nozzle holder 20.

If the valve 14 is opened on the side of the cleaning liquid supply source 13 under the state shown in FIG. 6 so as to supply the cleaning liquid into the free space $S_2$ such that a prescribed amount of the cleaning liquid is kept stored in the free space $S_2$, the spiral groove 20b formed on the inner circumferential surface of the nozzle holder 20 permits the cleaning liquid to flow downward uniformly along the entire outer circumferential surface of the main nozzle 1 while forming a whirling stream. The residual coating liquid attached to the main nozzle 1 can be effectively washed away by the whirling stream of the cleaning liquid so as to wash the main nozzle 1. Then, if the valve 14 is closed on the side of the cleaning liquid supply source 13 and opened on the side of the gas supply source 12 so as to supply the $N_2$ gas from the gas supply source 12 into the free space $S_2$, the $N_2$ gas flows along the spiral groove formed on the inner circumferential surface of the nozzle holder 20 so as to generate a whirling stream, with the result that the outer circumferential surface of the main nozzle 1 and the inner circumferential surface of the nozzle holder 20 can be effectively dried.

Incidentally, it is possible to supply the $N_2$ gas together with the cleaning liquid into the free space $S_2$ in the coating liquid supply nozzle 110b, too. In this case, the main nozzle 1 can be washed more effectively because of the cleaning effect produced by the cleaning liquid itself, the effect produced by the whirling stream of the cleaning liquid and the cleaning effect produced by the bubbles of the $N_2$ gas.

Figure 7:
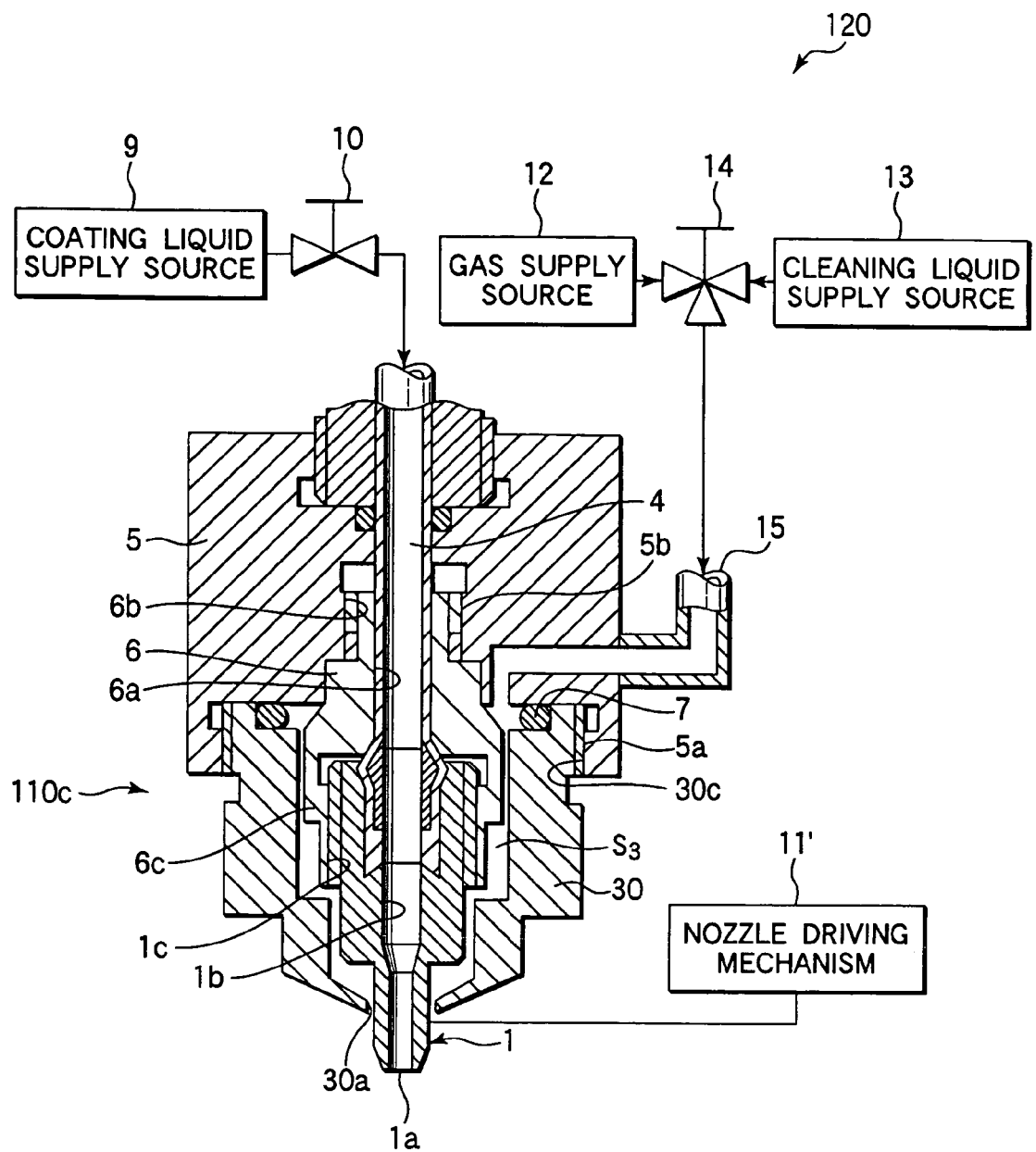
FIG. 7 is a vertical cross sectional view schematically showing the construction of a coating liquid supply nozzle according to a third embodiment of the present invention.

A process liquid supply nozzle according to a third embodiment of the present invention will now be described. FIG. 7 is a vertical cross sectional view schematically showing the construction of a coating liquid supply nozzle 110c according to the third embodiment of the process liquid supply nozzle of the present invention. The coating liquid supply nozzle 110c is equal in construction to the coating liquid supply nozzle 110a described previously except some constructions. First of all, a nozzle holder 30 included in the coating liquid supply nozzle 110c differs in shape from the nozzle holder 2 included in the coating liquid supply nozzle 110a. Also, the nozzle holder 30 is fixed, though the nozzle holder 2 can be rotated by the holder driving mechanism 11. Further, in the coating liquid supply nozzle 110c, the main nozzle 1 can be rotated about its own axis extending in the longitudinal direction within an angle not larger than 90° by a nozzle driving mechanism 11', though the main nozzle 1 is fixed in the coating liquid supply nozzle 110a. The following description is directed mainly to the above-noted differences between the coating liquid supply nozzle 110a and the coating liquid supply nozzle 110c.

In the coating liquid supply nozzle 110c, the screw portion 1c of the main nozzle 1 is engaged with the screw portion 6c of the nozzle fixing portion 6 so as to permit the main nozzle 1 to be rotatable about its own axis extending in the longitudinal direction of the main nozzle 1 at an angle not larger than 90°. The nozzle driving mechanism 11' for rotating the main nozzle 1 is arranged detachable from the main nozzle 1 under the state that the coating liquid supply nozzle 110c is positioned on the drain cup 84.

In the coating liquid supply nozzle 110a described previously, the nozzle holder 2 is detachable from the holder base 3, and the holder base 3 is fixed to the holding member 5. In the coating liquid supply nozzle 110c, however, a nozzle holder 30 is fixed directly to the holding member 5. To be more specific, a screw portion 30c formed in the nozzle holder 30 is engaged with a screw portion 5a formed in the holding member 5 so as to join the nozzle holder 30 to the holding member 5. Incidentally, the packing 7 is arranged in the joining portion so as to prevent the leakage of the cleaning liquid and the gas.

Figure 8:
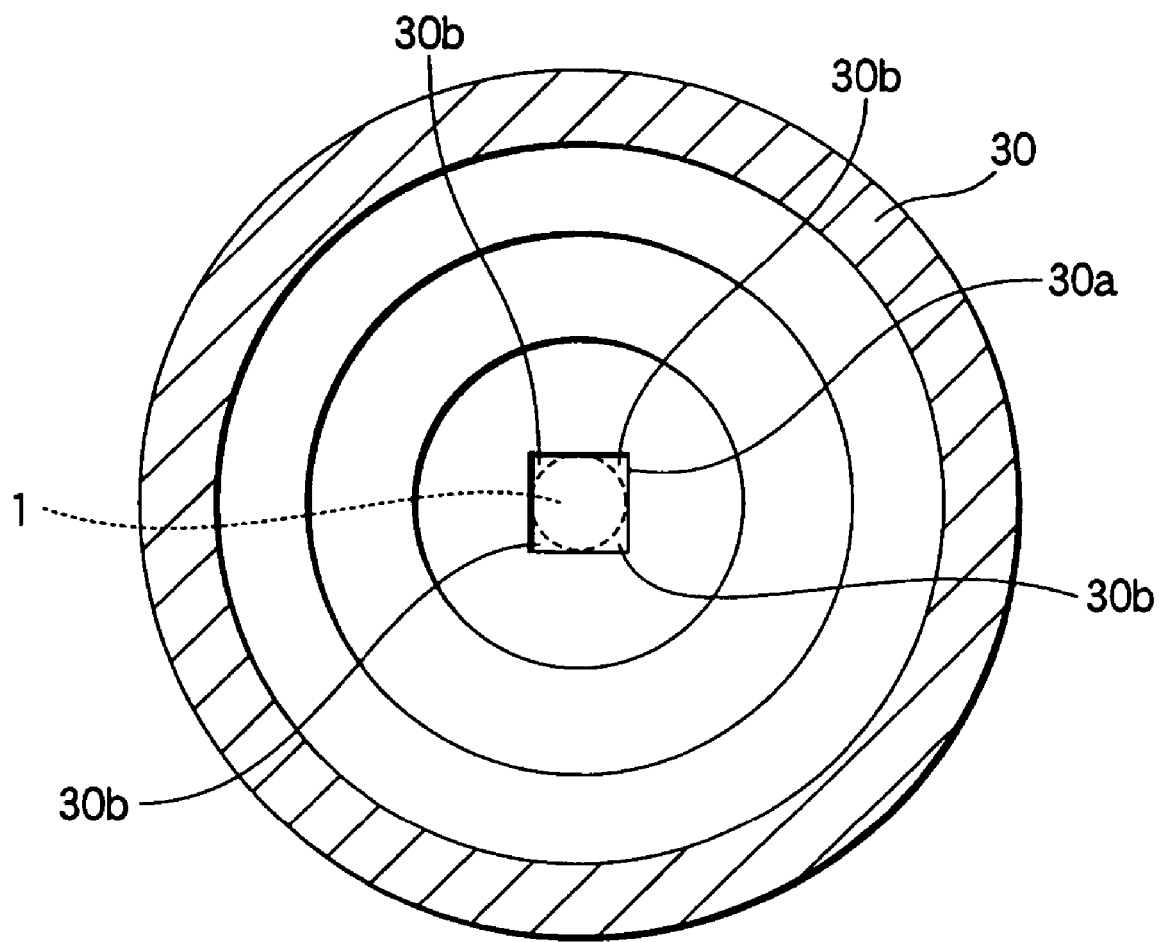
FIG. 8 is a horizontal cross sectional view showing the nozzle holder constituting the coating liquid supply nozzle shown in FIG. 7.

A free space $S_3$ is formed between the inner circumferential surface of the nozzle holder 30 and the outer circumferential surface of the main nozzle 1. The nozzle holder 30 is tapered in the tip portion (lower end portion) such that the thickness of the nozzle holder 30 is rendered smaller toward the tip, and a hole portion 30a is formed at the tip of the nozzle holder 30. As apparent from the horizontal cross sectional view given in FIG. 8, the hole portion 30a has a square planar shape, and the outer circumferential surface of the main nozzle 1 is substantially in a point-to-point contact with each side of the square hole portion 30a. As a result, four clearances 30b equal to each other in the open area are formed between the outer circumferential surface of the main nozzle 1 and the wall surface of the hole portion 30a. In other words, the four clearances 30b are formed at the corner portions of the square hole portion 30a. These clearances 30b perform the function of the discharge ports for discharging the cleaning liquid and the gas.

As described previously, the coating liquid supply nozzle 110a can be renewed under the state that the nozzle holder 2 is detached from the coating liquid supply nozzle 110a. Therefore, in the case of using the coating liquid supply nozzle 110c, it is necessary to form in the coating process unit 100 an additional mechanism for rotating the nozzle holder 30 so as to permit the nozzle holder 30 to be mounted to or detached from the coating liquid supply nozzle 110c.

The coating liquid discharge operation performed by the coating liquid supply nozzle 110c is equal to that performed by the coating liquid supply nozzle 110a described previously and, thus, the description is omitted in respect of the coating liquid discharge operation performed by the coating liquid supply nozzle 110c. The coating liquid supply nozzle 110c itself is washed as follows. Specifically, a prescribed amount of the cleaning liquid is supplied such that the free space $S_3$ of the coating liquid supply nozzle 110c arranged above the drain cup 84 is filled with a prescribed amount of the cleaning liquid, and that a prescribed amount of the cleaning liquid flows downward from the clearances 30b formed between the wall surface of the hole portion 30a and the outer circumferential surface of the main nozzle 1.

It should be noted that the four clearances 30b are equal to each other in the open area and, thus, the cleaning liquid discharged from the clearances 30b flows uniformly toward the tip portion of the main nozzle 1. Also, the outer circumferential surface of the main nozzle 1 is substantially in a point-to-point contact with the wall surface of the hole portion 30a. It follows that the residual coating liquid is washed away completely by the cleaning liquid in any of the contact points. In short, the outer circumferential surface of the main nozzle 1 can be washed uniformly over the entire region in the coating liquid supply nozzle 110c. Further, after the cleaning for a prescribed time, the main nozzle 1 is rotated by the nozzle driving mechanism 11' by, for example, 45° so as change the contact point between the main nozzle 1 and the nozzle holder 30, followed by performing again the cleaning processing. The particular construction of this embodiment makes it possible to wash away effectively the coating liquid remaining in the contact point between the main nozzle 1 and the nozzle holder 30 after the coating processing. It is also possible to rotate the main nozzle 1 during the subsequent drying processing.

In the embodiment described above, the hole portion 30a of the nozzle holder 30 has a square planar shape. However, it is also possible for the hole portion 30a to have a regularly polygonal planar shape such as a regularly triangular planar shape or a regularly hexagonal planar shape. Where the hole portion 30a has a regularly polygonal planar shape, the main nozzle 1 can be brought into a point-to-point contact with the midpoint of each side of the regularly polygonal planar shape and, thus, the coating liquid can be prevented from remaining in the contact point. Also, in the coating liquid supply nozzle 110c, the main nozzle 1 is rotated by the nozzle driving mechanism 11'. However, it is also possible to employ the construction that the main nozzle 1 is fixed and the nozzle holder 30 can be rotated by a prescribed angle as in the coating liquid supply nozzle 110a described previously. Further, it is possible for the nozzle driving mechanism 11' to be kept mounted to the main nozzle 1. In this case, the nozzle driving mechanism 11' is required to be constructed such that the cleaning liquid is not attached thereto after the cleaning processing applied to the main nozzle 1. Still further, since it is necessary to wash the main nozzle 1 every time the coating liquid is discharged, it is possible for the main nozzle 1 to be rotated manually.

Figure 9:
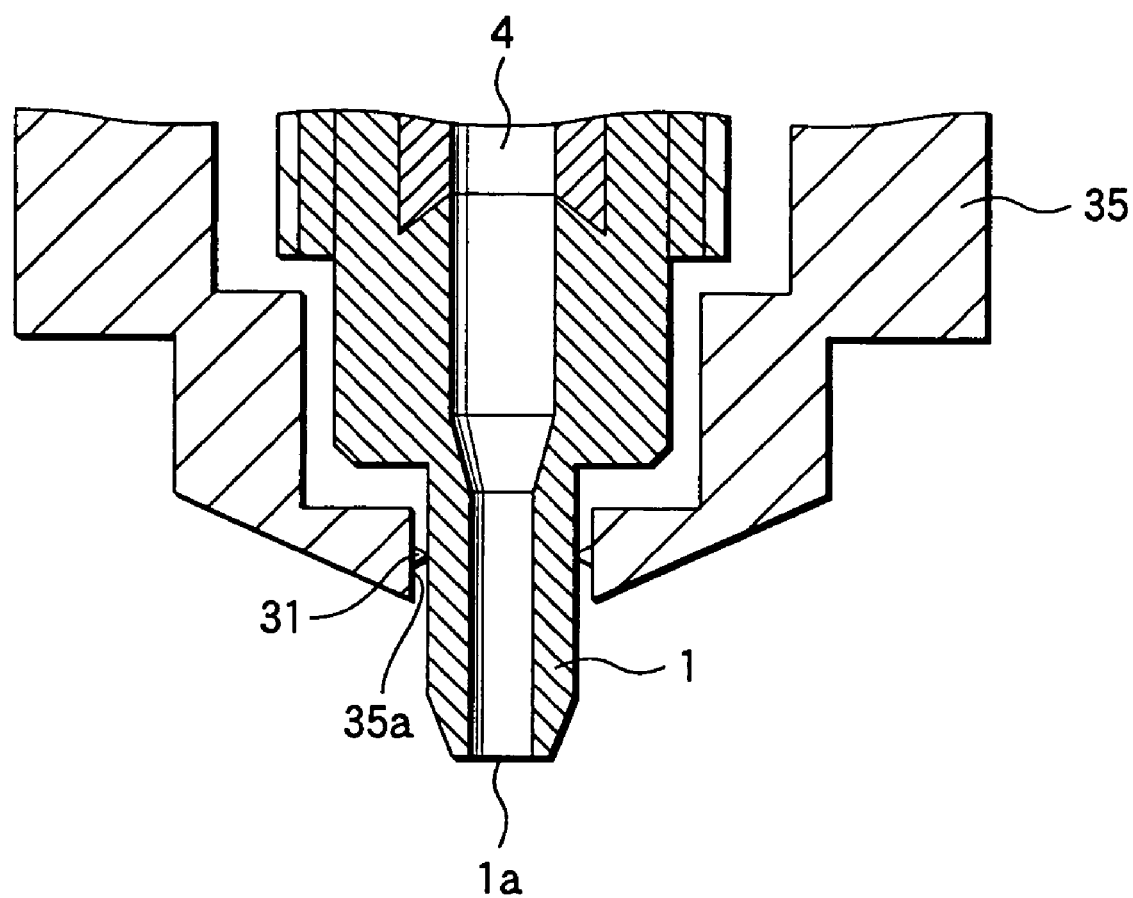
FIG. 9 is a vertical cross sectional view showing a modification of the nozzle holder shown in FIG. 7.
Figure 10A:
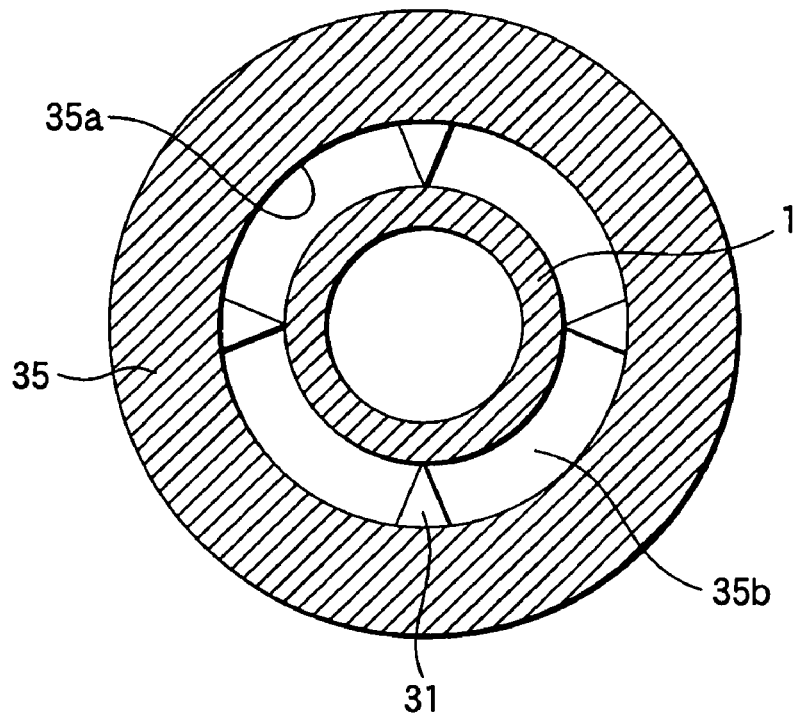
FIG. 10A is a horizontal cross sectional view showing the type of the through-hole included in the nozzle holder shown in FIG. 9.

It is possible for the nozzle holder 30 to be modified into a nozzle holder 35 as shown in FIGS. 9 and 10A. FIG. 9 is a vertical cross sectional view schematically showing the construction of the nozzle holder 35, and FIG. 10A is a horizontal cross sectional view of the nozzle holder 35. A through-hole 35a, which is formed at the lower end portion of the nozzle holder 35, has a circular planar shape, and four projections 31 projecting radially inward are equidistantly formed on the wall surface of the through-hole 35a. The main nozzle 1 is arranged in the center of the through-hole 35a such that the outer circumferential surface of the main nozzle 1 is in a point-to-point contact with each of these four projections 31. As a result, four clearances 35b equal to each other in the size and shape are formed around the main nozzle 1. These clearances 35b are equal in function to the clearances 30b described previously.

Incidentally, the number of projections 31 is not limited to four. It is possible to determine appropriately the number of projections 31 as far as the tip portion of the main nozzle 1 can be arranged in the center of the through-hole 35a, and the cleaning liquid, etc. can be discharged uniformly through the clearance between the wall surface of the through-hole 35a and the outer circumferential surface of the main nozzle 1. For example, it suffices to form at least three projections 31.

Figure 10B:
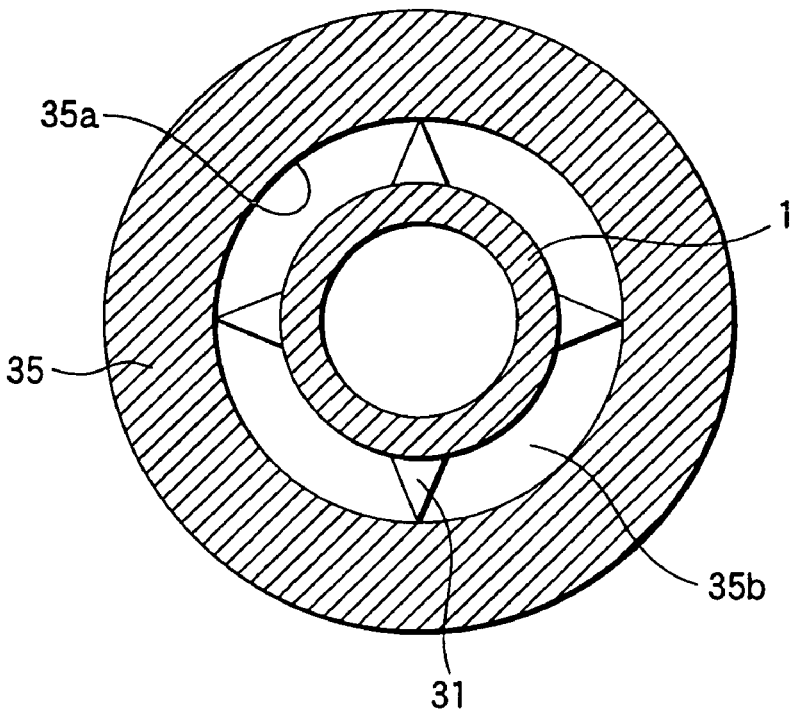
FIG. 10B is a horizontal cross sectional view showing a modification of the coating liquid supply nozzle shown in FIG. 9.

In the nozzle holder 35, the projections 31 are formed on the wall surface of the through-hole 35a. However, as shown in FIG. 10B, it is possible to form at least three projections 31 on the outer circumferential surface of the main nozzle 1 such that each of these projections 31 is brought into a point-to-point contact with the wall surface of the through-hole 35a.

Figure 11:
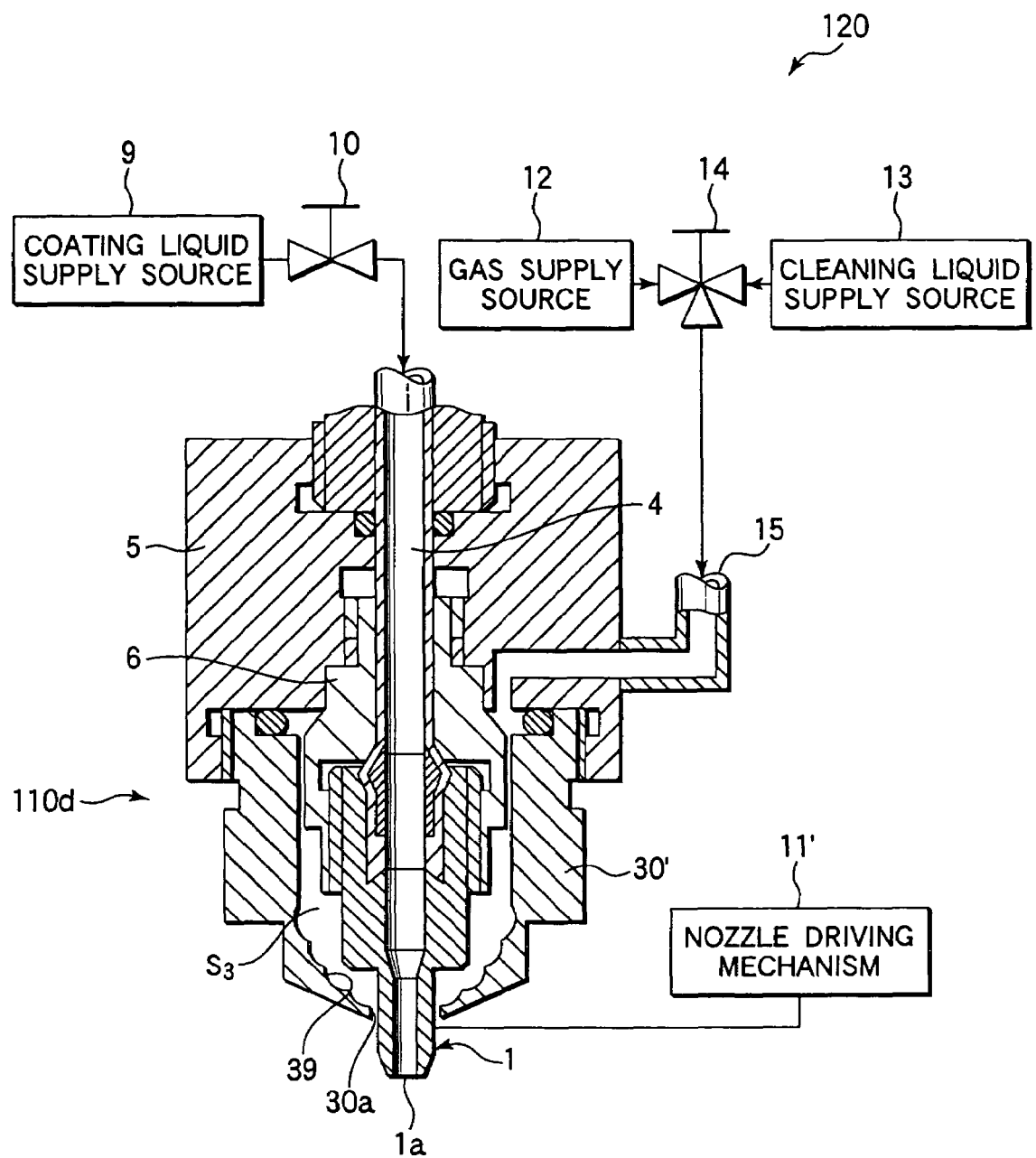
FIG. 11 is a vertical cross sectional view schematically showing the construction of a coating liquid supply nozzle according to a fourth embodiment of the present invention.
Figure 12:
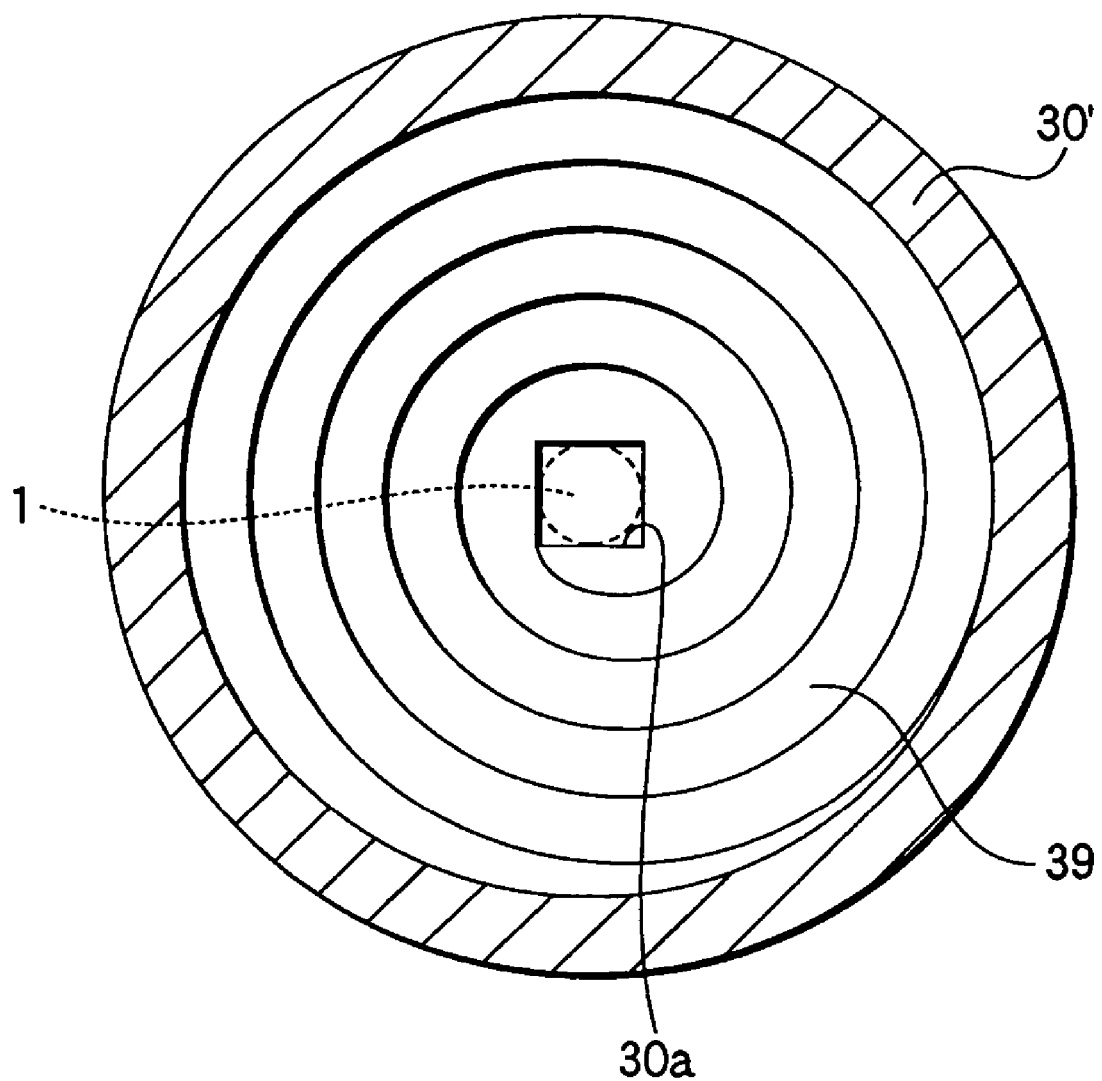
FIG. 12 is a horizontal cross sectional view showing the nozzle holder constituting the coating liquid supply nozzle shown in FIG. 11.

It is also possible to modify the nozzle holder 30 as shown in FIGS. 11 and 12. FIG. 11 is a vertical cross sectional view schematically showing the construction of a coating liquid supply nozzle 110d including a nozzle holder 30', and FIG. 12 is a horizontal cross sectional view showing the nozzle holder 30'. The coating liquid supply nozzle 110d is equal to the coating liquid supply nozzle 110c described previously, except that the nozzle holder 30' included in the coating liquid supply nozzle 110d differs in construction from the nozzle holder 30 included in the coating liquid supply nozzle 110c. Such being the situation, the construction of the nozzle holder 30' alone will now be described.

A spiral groove 39 is formed in the lower portion on the inner circumferential surface of the nozzle holder 30'. The spiral groove 39 starts from about the point where the vertical portion is changed into an inclined portion on the inner circumferential surface of the nozzle holder 30' and extends to communicate with the hole portion 30a formed in the lower edge of the nozzle holder 30'. The spiral groove 39 of the particular construction serves to generate a whirling stream in the cleaning liquid supplied into the free space $S_3$. The whirling stream of the cleaning liquid thus generated flows down while wetting the outer circumferential surface of the main nozzle 1 over the entire region so as to wash the outer circumferential surface of the main nozzle 1. The whirling stream of the cleaning liquid also washes uniformly the tip portion of the main nozzle 1 over the entire region when the cleaning liquid is discharged from the hole portion 30a. Further, a whirling stream of a gas is generated along the spiral groove 39 when the gas is supplied into the free space $S_3$ for drying the outer circumferential surface of the main nozzle 1 and the inner circumferential surface of the nozzle holder 30'. It follows that the drying processing can be performed more effectively.

Figure 13:
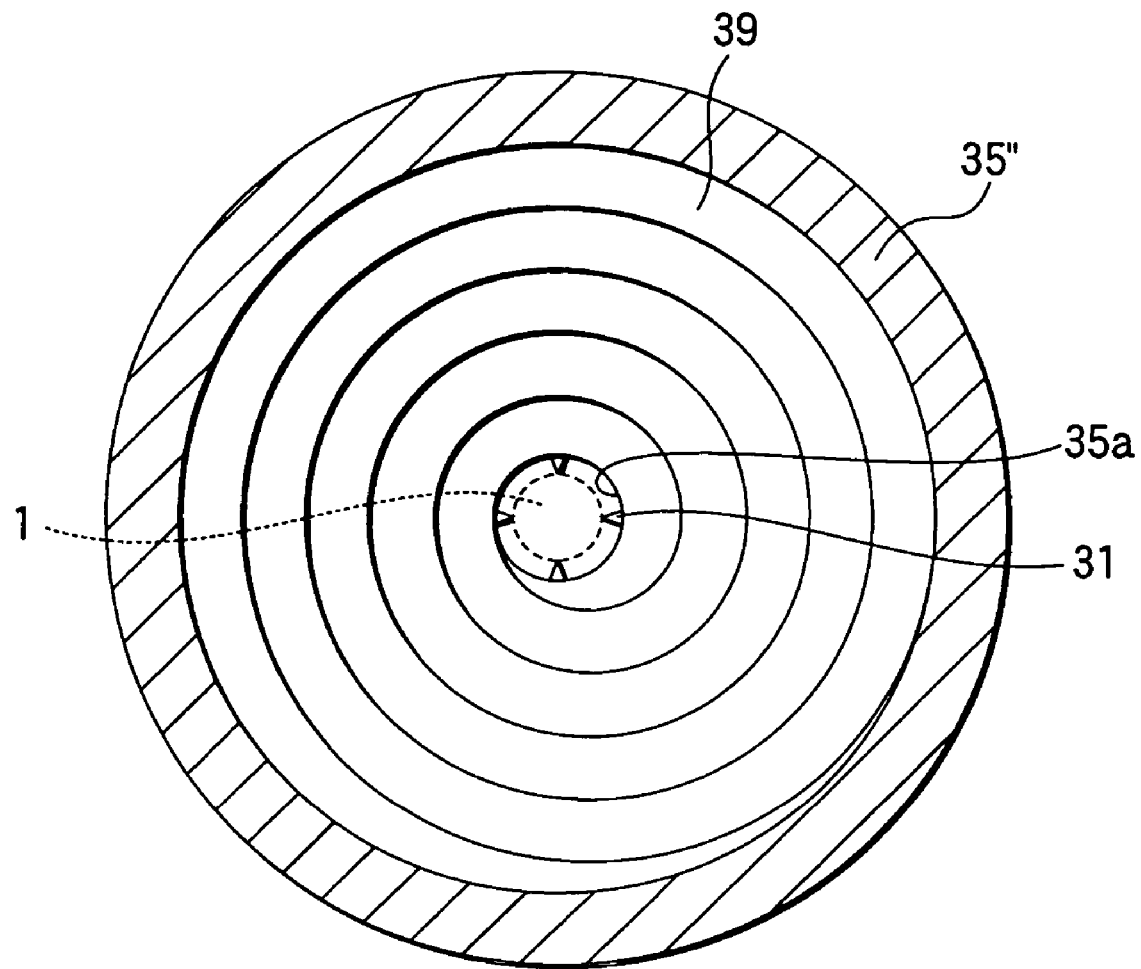
FIG. 13 is a horizontal cross sectional view showing a modification of the nozzle holder constituting the coating liquid supply nozzle shown in FIG. 9.
Figure 14:
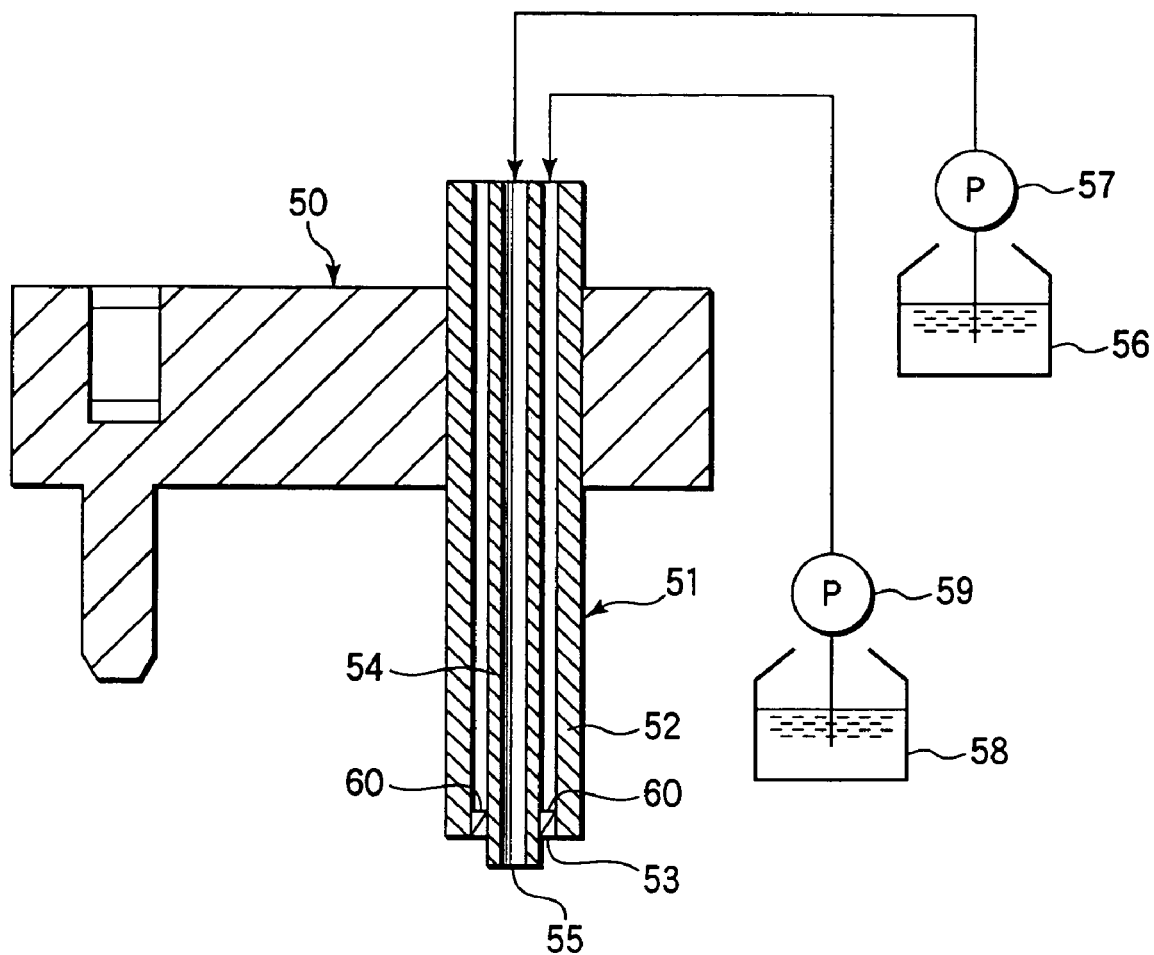
FIG. 14 is a vertical cross sectional view schematically showing the construction of the conventional process liquid supply nozzle and the process liquid supply section.
Figure 15:
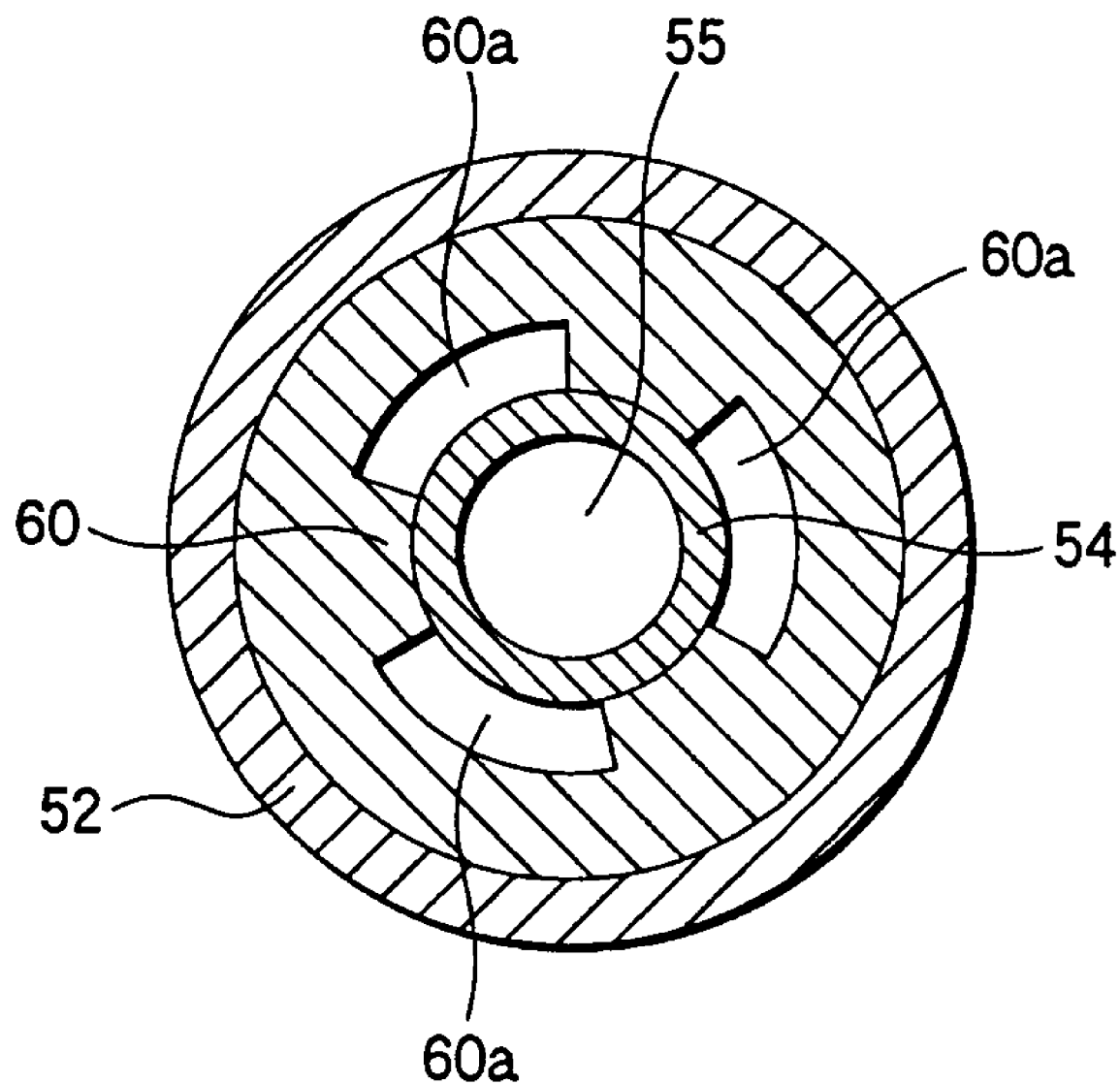
FIG. 15 is a horizontal cross sectional view showing the holding member shown in FIG. 14.

It is possible to form the spiral groove 39 in the nozzle holder 35 described previously. FIG. 13 is a horizontal cross sectional view showing a nozzle holder 35" constructed such that the spiral groove 39 is formed in the lower portion on the inner circumferential surface of the nozzle holder 35 described previously.

The present invention is not limited to the embodiments described above. For example, in the coating liquid supply nozzle 110a, the nozzle holder 3 is rotated by the nozzle holder driving mechanism 11 so as to be moved in the vertical direction. Alternatively, it is also possible to make the main nozzle 1 itself movable in the vertical direction so as to permit the entire main nozzle 1 to be housed in the nozzle holder 3. Also, each of the embodiments described above is directed to a coating process unit included in an SOD system. However, the technical idea of the present invention can also be applied to the formation of an SOG (Spin On Glass) film, a resist film, a polyimide film, a ferroelectric film, and other insulating films. Further, each of the embodiments described above is directed to the formation of an interlayer insulating film on a semiconductor wafer. However, the technical idea of the present invention can also be applied to an apparatus for forming, for example, a resist film on a glass substrate used in an FPD (Flat Panel Display), a mask, etc.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. A process liquid supply device comprising:
   a substantially tubular nozzle provided with a discharge port for discharging a process liquid;
   a substantially bowl-shaped nozzle holder provided with a through-hole into which the nozzle can be inserted;
   a free space formed between an inner circumferential surface of the nozzle holder and an outer circumferential surface of the nozzle, at least a prescribed cleaning liquid being supplied into the free space;
   a nozzle holder driving mechanism configured to drive the nozzle holder relative to the nozzle in a vertical direction between a position where the nozzle is accommodated in the nozzle holder, and a position where the nozzle protrudes from the through-hole; and
   controlling means for controlling a supply mechanism of the cleaning liquid and supply of a process liquid, such that the cleaning liquid is supplied into the free space to clean the nozzle when the nozzle holder is placed at the position where the nozzle is accommodated in the nozzle holder, and the process liquid is discharged from the nozzle when the nozzle holder is placed at the position where the nozzle protrudes from the through-hole.

2. The process liquid supply device according to claim 1, wherein a gas is supplied into the free space under the state that the nozzle is housed in the nozzle holder.

3. A process liquid supply device comprising:
a substantially tubular nozzle provided with a discharge port for discharging a process liquid;
a substantially bowl-shaped nozzle holder provided with a through-hole into which the nozzle can be inserted;
a free space formed between an inner circumferential surface of the nozzle holder and an outer circumferential surface of the nozzle, at least a prescribed cleaning liquid being supplied into the free space; and
means for relatively moving the nozzle holder and the nozzle in a vertical direction such that the process liquid is discharged from the discharge port of the nozzle in a state that the discharge port of the nozzle protrudes downward from the through-hole, and the nozzle is cleaned with a cleaning liquid in a state that the nozzle is housed in the nozzle holder,
wherein a spiral groove is formed on the inner circumferential surface of the nozzle holder.

4. A process liquid supply device comprising:
a substantially tubular nozzle provided with a discharge port for discharging a process liquid;
a substantially bowl-shaped nozzle holder provided with a through-hole into which the nozzle can be inserted;
a free space formed between an inner circumferential surface of the nozzle holder and an outer circumferential surface of the nozzle, at least a prescribed cleaning liquid being supplied into the free space; and
means for relatively moving the nozzle holder and the nozzle in a vertical direction such that the process liquid is discharged from the discharge port of the nozzle in a state that the discharge port of the nozzle protrudes downward from the through-hole, and the nozzle is cleaned with a cleaning liquid in a state that the nozzle is housed in the nozzle holder,
wherein the outer circumferential surface of the nozzle is rough and exhibits a hydrophilicity.

5. A process liquid supply device comprising:
a substantially tubular nozzle provided with a discharge port for discharging a process liquid;
a substantially bowl-shaped nozzle holder provided with a hole portion having a regularly polygonal planar shape into which the nozzle can be inserted; and
a free space formed between an outer circumferential surface of the nozzle and an inner circumferential surface of the nozzle holder, at least a prescribed cleaning liquid being supplied into the free space,
wherein the nozzle is arranged to extend through a central portion of the hole portion, and the outer circumferential surface of the nozzle is substantially in a point-to-point contact with a wall of the hole portion in a midpoint of each side of the regularly polygonal planar shape.

6. The process liquid supply device according to claim 5, further comprising means for rotating at least one of the nozzle and the nozzle holder by a prescribed angle.

7. The process liquid supply device according to claim 5, wherein a spiral groove is formed on the inner circumferential surface of the nozzle holder.

8. The process liquid supply device according to claim 5, wherein the outer circumferential surface of the nozzle is rough and exhibits a hydrophilicity.

9. A process liquid supply device, comprising:
a process liquid supply nozzle including a substantially tubular nozzle provided with a discharge port for discharging a process liquid, a substantially bowl-shaped nozzle holder provided with a through-hole into which the nozzle can be inserted, and a free space formed between an inner circumferential surface of the nozzle holder and an outer circumferential surface of the nozzle;
a process liquid supply mechanism for supplying the process liquid into the nozzle;
a cleaning liquid supply mechanism for supplying a prescribed cleaning liquid into the free space for cleaning the nozzle;
a nozzle holder driving mechanism configured to drive the nozzle holder relative to the nozzle in a vertical direction between a position where the nozzle is accommodated in the nozzle holder, and a position where the nozzle protrudes from the through-hole; and
controlling means for controlling the cleaning liquid supply mechanism and the process liquid supply mechanism, such that the cleaning liquid is supplied into the free space to clean the nozzle when the nozzle holder is placed at the position where the nozzle is accommodated in the nozzle holder, and the process liquid is discharged from the nozzle when the nozzle holder is placed at the position where the nozzle protrudes from the through-hole.

10. A process liquid supply device comprising:
a process liquid supply nozzle including a substantially tubular nozzle provided with a discharge port for discharging a process liquid, a substantially bowl-shaped nozzle holder provided with a through-hole into which the nozzle can be inserted, and a free space formed between an inner circumferential surface of the nozzle holder and an outer circumferential surface of the nozzle;
a process liquid supply mechanism for supplying the process liquid into the nozzle;
a cleaning liquid supply mechanism for supplying a prescribed cleaning liquid into the free space for cleaning the nozzle; and
a nozzle moving mechanism for relatively moving the nozzle and the nozzle holder in a vertical direction such that the process liquid is discharged from the discharge port of the nozzle in a state that the discharge port protrudes downward from the through-hole of the nozzle holder or the nozzle is cleaned with the cleaning liquid in a state that the nozzle is housed in the nozzle holder,
wherein a spiral groove is formed on the inner circumferential surface of the nozzle holder.

11. A process liquid supply device comprising:
a process liquid supply nozzle including a substantially tubular nozzle provided with a discharge port for discharging a process liquid, a substantially bowl-shaped nozzle holder provided with a through-hole into which the nozzle can be inserted, and a free space formed between an inner circumferential surface of the nozzle holder and an outer circumferential surface of the nozzle;
a process liquid supply mechanism for supplying the process liquid into the nozzle;
a cleaning liquid supply mechanism for supplying a prescribed cleaning liquid into the free space for cleaning the nozzle; and
a nozzle moving mechanism for relatively moving the nozzle and the nozzle holder in a vertical direction such that the process liquid is discharged from the discharge port of the nozzle in a state that the discharge port protrudes downward from the through-hole of the nozzle holder or the nozzle is cleaned with the cleaning liquid in a state that the nozzle is housed in the nozzle holder, wherein the outer circumferential surface of the nozzle is rough and exhibits a hydrophilicity.

12. A process liquid supply device, comprising:

a process liquid supply nozzle including a substantially tubular nozzle provided with a discharge port for discharging a prescribed process liquid, a substantially bowl-shaped nozzle holder provided with a hole portion having a regularly polygonal planar shape into which the nozzle can be inserted, and a free space formed between an inner circumferential surface of the nozzle holder and an outer circumferential surface of the nozzle, the nozzle being arranged to extend through a central portion of the hole portion, and the outer circumferential surface of the nozzle being substantially in a point-to-point contact with a wall of the hole portion in a midpoint of each side of the regularly polygonal planar shape;

a process liquid supply mechanism for supplying the prescribed process liquid into the nozzle; and a cleaning liquid supply mechanism for supplying a prescribed cleaning liquid into the free space for cleaning the nozzle.

13. The process liquid supply device according to claim 12, further comprising a rotating mechanism for rotating at least one of the nozzle and the nozzle holder by a prescribed angle.

14. The process liquid supply device according to claim 12, further comprising a gas supply mechanism for supplying a prescribed gas into the free space.

15. The process liquid supply device according to claim 12, wherein a spiral groove is formed on the inner circumferential surface of the nozzle holder.

16. The process liquid supply device according to claim 12, wherein the outer circumferential surface of the nozzle is rough and exhibits a hydrophilicity.

* * * * *